United States Patent
Ide et al.

(10) Patent No.: US 7,499,249 B2
(45) Date of Patent: Mar. 3, 2009

(54) SPIN VALVE-GMR ELEMENT IN WHICH A NON-METAL LAMINATE LAYER IS PROVIDED AS A FREE MAGNETIC LAYER AND METHOD OF MANUFACTURING THE SAME

(75) Inventors: Yosuke Ide, Niigata-ken (JP);
Masamichi Saito, Niigata-ken (JP);
Masahiko Ishizone, Niigata-ken (JP);
Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 440 days.

(21) Appl. No.: 11/409,879

(22) Filed: Apr. 24, 2006

(65) Prior Publication Data
US 2006/0262460 A1 Nov. 23, 2006

(30) Foreign Application Priority Data
Apr. 28, 2005 (JP) ............................. 2005-132437
Apr. 28, 2005 (JP) ............................. 2005-132460

(51) Int. Cl.
*G11B 5/39* (2006.01)
(52) U.S. Cl. ............................................. 360/324.12
(58) Field of Classification Search ............. 360/324.1, 360/324.11, 324.12, 324.2
See application file for complete search history.

(56) References Cited

U.S. PATENT DOCUMENTS

| | | | |
|---|---|---|---|
| 7,035,062 B1 * | 4/2006 | Mao et al. ................. | 360/324.2 |
| 7,428,130 B2 * | 9/2008 | Jogo et al. .............. | 360/324.12 |
| 2003/0137785 A1 | 7/2003 | Saito | |
| 2005/0073778 A1 * | 4/2005 | Hasegawa et al. ......... | 360/324.1 |
| 2006/0050446 A1 * | 3/2006 | Ishizone et al. ......... | 360/324.12 |
| 2006/0227467 A1 * | 10/2006 | Ide et al. .................. | 360/324.11 |
| 2006/0268465 A1 * | 11/2006 | Ide et al. ..................... | 360/313 |
| 2007/0048551 A1 * | 3/2007 | Ide et al. .................. | 428/811.2 |
| 2007/0109693 A1 * | 5/2007 | Carey et al. ............. | 360/324.12 |
| 2007/0115596 A1 * | 5/2007 | Nakabayashi et al. ....... | 360/324 |
| 2008/0112095 A1 * | 5/2008 | Carey et al. ............. | 360/324.12 |
| 2008/0226947 A1 * | 9/2008 | Mizuno et al. .............. | 428/811 |

FOREIGN PATENT DOCUMENTS

JP 2003-218428 7/2003

\* cited by examiner

*Primary Examiner*—Jefferson Evans
(74) *Attorney, Agent, or Firm*—Brinks Hofer Gilson & Lione

(57) ABSTRACT

A magnetic detecting element capable of maintaining a large ΔRA and reducing magnetostriction by changing a material of a free magnetic layer, and a method of manufacturing the same is provided. A CoMnXZ alloy layer or CoMnXRh alloy layer is formed in a free magnetic layer where an element X is at least one or two elements of Ge, Ga, In, Si, Pb, and Zn, and an element X in the latter case is at least one or two elements of Ge, Ga, In, Si, Pb, Zn, Sn, Al, and Sb. By forming the CoMnXZ alloy layer or the CoMnXRh alloy layer in the free magnetic layer, the magnetostriction of the free magnetic layer can be reduced while maintaining the large ΔRA, compared with a case where only the CoMnX alloy is formed.

35 Claims, 7 Drawing Sheets

SPIN VALVE-GMR ELEMENT IN WHICH A NON-METAL LAMINATE LAYER IS PROVIDED AS A FREE MAGNETIC LAYER AND METHOD OF MANUFACTURING THE SAME

BACKGROUND OF THE INVENTION

1. Field of the Invention

The present invention relates to a magnetic detecting element including a pinned magnetic layer having a pinned magnetization direction and a free magnetic layer formed on the pinned magnetic layer having a non-magnetic material layer disposed between and of which the magnetization direction is changed by an external magnetic field, and more particularly, to a magnetic detecting element capable of maintaining a large product $\Delta RA$ of a magnetic resistance change $\Delta R$ and an element area A and reducing magnetostriction, and a method of manufacturing the same.

2. Description of the Related Art

FIG. 11 is a partial cross-sectional view showing a structure of a conventional magnetic detecting element (spin valve thin film element), as viewed from a surface facing a recording medium.

Reference numeral 1 of FIG. 11 denotes an underlying layer made of Ta. A seed layer 2 made of metal having a body centered cubic crystal structure (bcc structure), such as Cr, is formed on the underlying layer 1.

On the seed layer 2, a multilayer film T, in which an antiferromagnetic layer 3, a pinned magnetic layer 4, a non-magnetic material layer 5, a free magnetic layer 6, and a protective layer 7 are sequentially laminated, is formed.

The protective layer 7 is made of Ta, the non-magnetic material layer 5 is made of Cu, the free magnetic layer 6 and the pinned magnetic layer 4 are made of a Heusler alloy such as $Co_2MnGe$, and the antiferromagnetic layer 3 is made of PtMn.

Electrode layers 10 and 10 are provided above and below the multilayer film T1, and DC sensing current flows in a direction perpendicular to the film planes of the individual layers of the multilayer film.

An exchange coupling magnetic field is produced between the antiferromagnetic layer 3 and the pinned magnetic layer 4 such that the magnetization of the pinned magnetic layer 4 is pinned in a height direction (Y direction shown in the drawing).

Hard bias layers 8 made of hard magnetic material such as CoPt are formed at the both sides of the free magnetic layer 6 such that upper and lower portions and ends of the hard bias layers 8 are insulated by an insulating layer 9. The magnetization of the free magnetic layer 6 is aligned in a track width direction (X direction shown in the drawing) by a longitudinal bias magnetic field from the hard bias layers 8.

When an external magnetic field is applied to the magnetic detecting element shown in FIG. 11, the magnetization direction of the free magnetic layer is changed relative to the magnetization direction of the pinned magnetic layer to change the resistance of the multilayer film. When the constant sensing current flows, the change in the resistance is converted to a voltage change to detect the external magnetic field.

The magnetic detecting element having the free magnetic layer made of the Heusler alloy is disclosed in Patent Document 1 (Japanese Unexamined Patent Application Publication No. 2003-218428 (U.S Publication. No. 2003/0137785)).

[Patent Document 1] Japanese Unexamined Patent Application Publication No. 2003-218428 (U.S. Publication No. 2003/0137785)

It can be seen that a product $\Delta RA$ of a magnetic resistance change $\Delta R$ and an element area A can increase by forming the free magnetic layer using the Heusler alloy. The improvement of $\Delta RA$ is a very important condition in practically realizing a CPP (current perpendicular to the plane) type magnetic detecting element having high record density.

However, when the Heusler alloy is used, $\Delta RA$ is improved, but the magnetostriction of the free magnetic layer increases. When the magnetostriction of the free magnetic layer is large, influence of stress due to layer formation distortion or a difference between thermal expansion coefficients increases or noise is generated upon the operation of a head. Thus, the magnetostriction of the free magnetic layer must be low while maintaining large $\Delta RA$.

SUMMARY OF THE INVENTION

Accordingly, the present invention has been achieved for solving the above problem, and an object of the present invention is to provide a magnetic detecting element which is capable of reducing magnetostriction while maintaining a large $\Delta RA$, and a method of manufacturing the same.

According to an aspect of the present invention, there is provided a magnetic detecting element of the present invention including a pinned magnetic layer of which the magnetization direction is pinned, and a free magnetic layer which is formed on the pinned magnetic layer having a non-magnetic material layer in between and of which the magnetization direction is changed by an external magnetic field, wherein the free magnetic layer has a CoMnXZ alloy layer made of metal compound represented by a composition formula of $Co_gMn_hX_iZ_j$ (element X is at least one element or two elements of Ge, Ga, In, Si, Pb, and Zn, element Z is at least one element or two elements of Al, Sn, and Cr, g, h, i, j are atomic %, and g+h+i+j=100 atomic %), and wherein the composition ratio of the element Z is modulated from the bottom to the top of the CoMnXZ alloy layer.

In the present invention, since the free magnetic layer has the CoMnXZ alloy layer, it is possible to reduce the magnetostriction of the free magnetic layer.

In the present invention, a region in which the composition ratio of the element Z increases and a region in which the composition ratio of the element Z decreases may alternately appear from the bottom to the top of the CoMnXZ alloy layer.

In the present invention, when the atomic % concentration of the element Z in the CoMnXZ alloy layer is in a range of 3 atomic % to 15 atomic %, it is possible to greatly reduce the magnetostriction and to maintain a large product $\Delta RA$ of a magnetic resistance change $\Delta R$ and an element area A of the magnetic detecting element.

In addition, a magnetic detecting element of the present invention is characterized in that the free magnetic layer has a laminate of a CoMnX alloy layer made of metal compound represented by a composition formula of $Co_gMn_hX_i$ (element X is at least one element or two elements of Ge, Ga, In, Si, Pb, and Zn, and g+h+i=100 atomic %) and an intermediate layer made of at least one element or two elements of Al, Sn, and Cr.

When a region in which a large amount of Al, Sn, or Cr exists is formed in the free magnetic layer mainly composed of the CoMnX alloy, the magnetostrictions of the layers are reduced. The Al, Sn, or Cr may be diffused in the CoMnX alloy as mentioned above, or an intermediate layer composed of Al, Sn, or Cr may be formed independence of the CoMnX alloy layer.

When a laminated structure in which the CoMnX layer and the intermediate layer are laminated one time forms a unit and the thickness ratio of the intermediate layer in the unit is represented by [thickness of the intermediate layer/(thickness of the CoMnX alloy layer+thickness of the intermediate layer)], the thickness ratio of the intermediate layer may be in a range of 0.08 to 0.20.

In order to reduce the magnetostriction of the magnetic detecting element and to maintain ΔRA, the thickness of the intermediate layer may be in a range of 1.0 angstroms to 3.0 angstroms.

In addition, the free magnetic layer may have a laminated structure in which diffusion suppressing layers made of a magnetic material are formed above and below the CoMnXZ alloy layer, and the diffusion suppressing layers may be in contact with the non-magnetic material layer. The diffusion suppressing layers may be made of a CoFe alloy. By this configuration, it is possible to properly suppress the CoMnXZ alloy layer from being diffused into the non-magnetic material layer.

Furthermore, in the present invention, the magnetic detecting element may include an antiferromagnetic layer, and the pinned magnetic layer which is in contact with the antiferromagnetic layer and of which the magnetization direction is pinned by an exchange anisotropy magnetic field with the antiferromagnetic layer, and the free magnetic layer which is formed on the pinned magnetic layer through the non-magnetic material layer.

In addition, in the present invention, the magnetic detecting element may include non-magnetic material layers laminated above and below the free magnetic layer, and pinned magnetic layers located above one of the non-magnetic material layers and below the other of the non-magnetic material layers. In this case, the magnetic detecting element may further include antiferromagnetic layers which are located above one of the pinned magnetic layers and below the other of the pinned magnetic layers to pin the magnetization directions of the pinned magnetic layers to a predetermined direction by an exchange anisotropy magnetic field.

Moreover, the present invention can apply to the structure of a CPP type magnetic detecting element, in which sensing current flows in a direction perpendicular to the film planes of the pinned magnetic layer, the non-magnetic material layer, and the free magnetic layer.

In addition, according to an another aspect of the present invention, there is provided a method of manufacturing a magnetic detecting element having a pinned magnetic layer of which the magnetization direction is pinned, and a free magnetic layer which is formed on the pinned magnetic layer through a non-magnetic material layer and of which the magnetization direction is changed by an external magnetic field, wherein the free magnetic layer has a laminate of a CoMnX alloy layer made of metal compound represented by a composition formula of $Co_gMn_hX_i$ (element X is at least one element or two elements of Ge, Ga, In, Si, Pb, and Zn, and g+h+i=100 atomic %) and an intermediate layer made of at least one element or two elements of Al, Sn, and Cr.

Accordingly, it is possible to easily manufacture a magnetic detecting element capable of reducing the magnetostriction of the free magnetic layer while maintaining a large ΔRA.

In the present invention, the CoMnX alloy layer and the intermediate layer may be alternately laminated.

At this time, when a laminated structure in which the CoMnX layer and the intermediate layer are laminated one time forms a unit and the thickness ratio of the intermediate layer in the unit is represented by [thickness of the intermediate layer/(thickness of the CoMnX alloy layer+thickness of the intermediate layer)], the thickness ratio of the intermediate layer may be in a range of 0.08 to 0.20.

When the thickness ratio of the intermediate layer is large, the magnetostriction of the pinned magnetic layer or the free magnetic layer can be reduced, but the reduction of ΔRA increases. Accordingly, by setting the thickness ratio of the intermediate layer in the above-mentioned range, the large ΔRA can be maintained while reducing the magnetostriction.

In the present invention, the thickness of the intermediate layer may be in a range of 1.0 angstroms to 3.0 angstroms.

In addition, the thickness of the CoMnX alloy layer may be in a range of 10 angstroms to 40 angstroms.

In the present invention, after forming the magnetic detecting element, the magnetic detecting element is subjected to a heat treatment. Accordingly, the CoMnX alloy layer or the CoMnXZ alloy layer is regularized by a $L_{21}$ type or $B_2$ type crystal structure.

In addition, according to still another aspect of the present invention, there is provided a magnetic detecting element comprising a pinned magnetic layer of which the magnetization direction is pinned, and a free magnetic layer which is formed on the pinned magnetic layer having a non-magnetic material layer in between and of which the magnetization direction is changed by an external magnetic field, wherein the free magnetic layer has a CoMnXRh alloy layer made of metal compound represented by a composition formula of $Co_gMn_hX_iRh_j$ (element X is at least one element or two elements of Ge, Ga, In, Si, Pb, Zn, Sn, Al, and Sb, g, h, i, j are atomic %, and g+h+i+j=100 atomic %), and wherein the atomic % concentration of the element Rh in the CoMnXRh alloy layer is in a range of 4 atomic % to 10 atomic %.

In the present invention, it is possible to more reduce the magnetostriction of the free magnetic layer compared with the prior art.

In the present invention, the atomic % concentration of the element Rh in the CoMnXRh alloy layer may be in a range of 7 atomic % to 10 atomic %.

In the present invention, the composition ratio of the element Rh may be modulated from the bottom to the top of the CoMnXRh alloy layer. Furthermore, a region in which the composition ratio of the element Rh increases and a region in which the composition ratio of the element Rh decreases may alternately appear from the bottom to the top of the CoMn XRh alloy layer.

In addition, the magnetic detecting element of the present invention is characterized in the free magnetic layer has a laminate of a CoMnX alloy layer made of metal compound represented by a composition formula of $Co_gMn_hX_i$ (element X is at least one element or two elements of Ge, Ga, In, Si, Pb, Zn, Sn, Al, and Sb, and g+h+i=100 atomic %) and an intermediate layer made of Rh, and the thickness of the intermediate layer is in a range of 1.0 angstroms to 3.0 angstroms.

In the present invention, it is possible to maintain the large ΔRA while reducing the magnetostriction of the magnetic detecting element.

In addition, the thickness of the intermediate layer may be in a range of 2.0 angstroms to 3.0 angstroms.

Furthermore, when a laminated structure in which the CoMnX layer and the intermediate layer are laminated one time forms a unit and the thickness ratio of the intermediate layer in the unit is represented by [thickness of the intermediate layer/(thickness of the CoMnX alloy layer+thickness of the intermediate layer)], the thickness ratio of the intermediate layer may be in a range of 0.04 to 0.13.

Also, the free magnetic layer may have a laminated structure in which diffusion suppressing layers made of a magnetic material are formed above and below the CoMnXRh alloy layer, and the diffusion suppressing layers may be in contact with the non-magnetic material layer. In particular, the diffusion suppressing layers may be made of a CoFe alloy. By this configuration, it is possible to properly suppress the CoMn XRh alloy layer from being diffused into the non-magnetic material layer.

In addition, in the present invention, the magnetic detecting element may include an antiferromagnetic layer, and the pinned magnetic layer which is in contact with the antiferromagnetic layer and of which the magnetization direction is pinned by an exchange anisotropy magnetic field with the antiferromagnetic layer, and the free magnetic layer which is formed on the pinned magnetic layer having the non-magnetic material layer in between.

Furthermore, in the present invention, the magnetic detecting element may include non-magnetic material layers laminated above and below the free magnetic layer, and pinned magnetic layers located above one of the non-magnetic material layers and below the other of the non-magnetic material layers. In this case, the magnetic detecting element may further include antiferromagnetic layers which are located above one of the pinned magnetic layers and below the other of the pinned magnetic layers to pin the magnetization directions of the pinned magnetic layers to a predetermined direction by an exchange anisotropy magnetic field.

Also, the present invention can apply to a CPP type magnetic detecting element in which sensing current flows in a direction perpendicular to the film planes of the pinned magnetic layer, the non-magnetic material layer, and the free magnetic layer.

In addition, according to a further aspect of the present invention, there is provided a method of manufacturing a magnetic detecting element having a pinned magnetic layer of which the magnetization direction is pinned, and a free magnetic layer which is formed on the pinned magnetic layer through a non-magnetic material layer and of which the magnetization direction is changed by an external magnetic field, wherein the free magnetic layer has a laminate of a CoMnX alloy layer made of metal compound represented by a composition formula of $Co_gMn_hX_i$ (element X is at least one element or two elements of Ge, Ga, In, Si, Pb, Zn, Sn, Al, and Sb, and g+h+i=100 atomic %) and an intermediate layer made of Rh, and wherein the thickness of the intermediate layer is in a range of 1.0 angstroms to 3.0 angstroms.

Accordingly, it is possible to easily manufacture a magnetic detecting element capable of reducing the magnetostriction of the free magnetic layer while maintaining a large $\Delta RA$.

In the present invention, the thickness of the intermediate layer may be in a range of 2.0 angstroms to 3.0 angstroms.

In the present invention, the CoMnX alloy layer and the intermediate layer may be alternately laminated.

At this time, when a laminated structure in which the CoMnX layer and the intermediate layer are laminated one time forms a unit and the thickness ratio of the intermediate layer in the unit is represented by [thickness of the intermediate layer/(thickness of the CoMnX alloy layer+thickness of the intermediate layer)], the thickness ratio of the intermediate layer may be in a range of 0.04 to 0.13.

When the thickness ratio of the intermediate layer is large, the magnetostriction of the pinned magnetic layer or the free magnetic layer can be reduced, but the reduction of $\Delta RA$ increases. Accordingly, by setting the thickness ratio of the intermediate layer in the above-mentioned range, the large $\Delta RA$ can be maintained while reducing the magnetostriction.

In the present invention, the thickness of the CoMnX alloy layer may be in a range of 10 angstroms to 40 angstroms.

In the present invention, after forming the magnetic detecting element, the magnetic detecting element is subjected to a heat treatment. Accordingly, the CoMnX alloy layer or the CoMnXRh alloy layer is regularized by a $L_{21}$ type or $B_2$ type crystal structure.

In the present invention, a region in which a large amount of Al, Sn, or Cr exists is formed in the free magnetic layer mainly composed of the CoMnX alloy. Al, Sn, or Cr may be diffused in the CoMnX alloy as mentioned above, or an intermediate layer composed of Al, Sn, or Cr may be formed independence of the CoMnX alloy layer.

Accordingly, it is possible to reduce the magnetostriction of the free magnetic layer while maintaining a large $\Delta RA$.

In addition, in the present invention, a region in which a large amount of Rh exists is formed in the free magnetic layer mainly composed of the CoMnX alloy. Rh may be diffused in the CoMnX alloy to form a CoMnXRh alloy, or an intermediate layer composed of Rh may be formed independence of the CoMnX alloy layer.

Accordingly, since the atomic % concentration of Rh in the CoMnXRh alloy is in a range of 4 atomic % to 10 atomic %, it is possible to reduce the magnetostriction of the free magnetic layer while maintaining a large $\Delta RA$.

Furthermore, since the thickness of the intermediate layer is in a range of 1.5 angstroms to 3.0 angstroms, it is possible to reduce the magnetostriction of the free magnetic layer while maintaining a large $\Delta RA$.

DESCRIPTION OF THE PREFERRED EMBODIMENT

Figure 1:
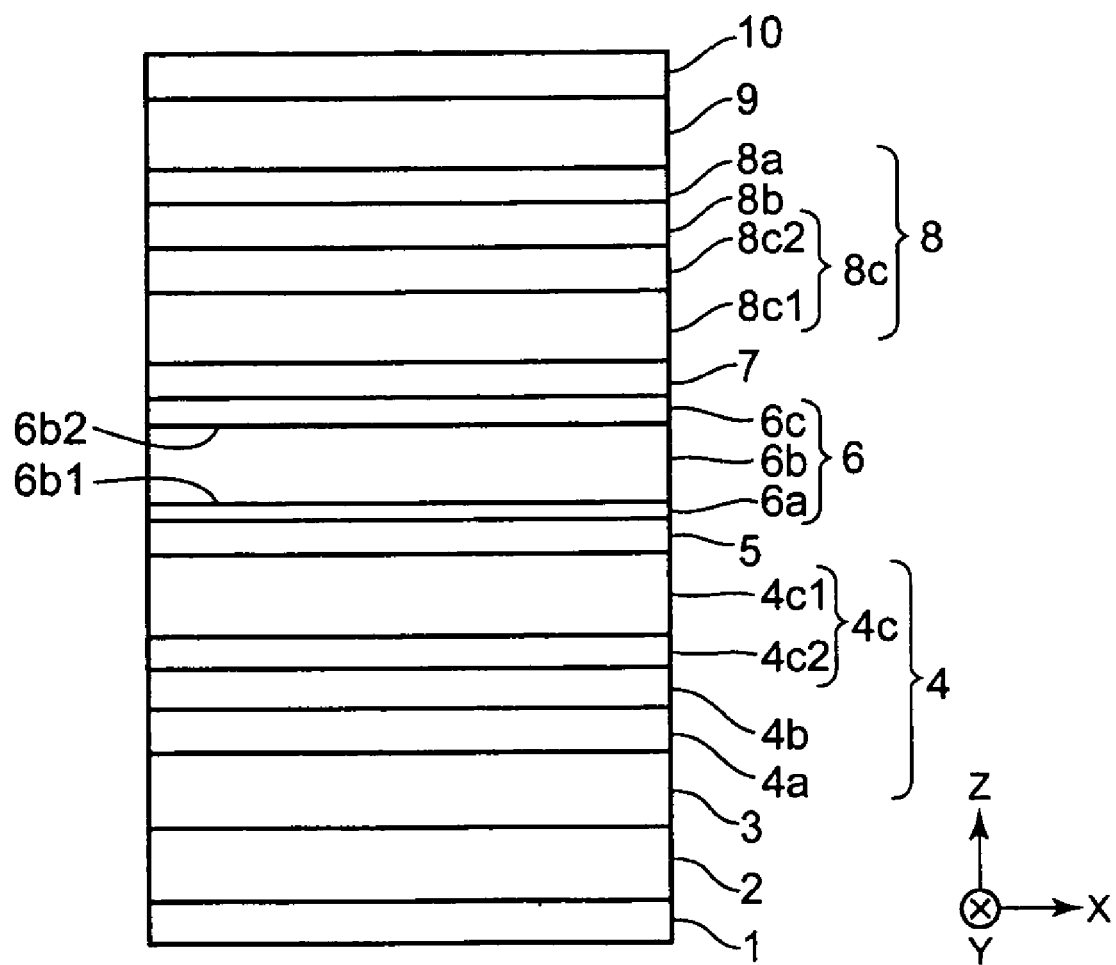
FIG. 1 is a view showing a structure of a magnetic detecting element (dual spin valve thin film element) according to a first embodiment of the present invention, as viewed from a surface facing a recording medium.

FIG. 1 is a view showing a laminated structure of a CPP type dual spin valve thin film element according to a first embodiment of the present invention.

The dual spin valve thin film element is provided on a trailing end of a floating slider provided in a hard disk device to detect a record magnetic field of a hard disk. In addition, the movement direction of a magnetic recording medium such as the hard disk is a Z direction and the direction of a magnetic field leaked from the magnetic recording medium is a Y direction.

At a lowermost layer of FIG. 1, an underlying layer 1 made of a non-magnetic material such as at least one element or two elements of Ta, Hf, Nb, Zr, Ti, Mo, and W. On the underlying layer 1, a seed layer 2 is provided. The seed layer 2 is made of NiFeCr or Cr. When the seed layer 2 is made of NiFeCr, the seed layer 2 has a face centered cubic structure (fcc) and an equivalent crystal plane which is represented as a (111) plane is preferentially oriented in a direction parallel to a film plane. Furthermore, when the seed layer 2 is made of Cr, the seed layer 2 has a body centered cubic structure (bcc) and an equivalent crystal plane which is represented as a (110) plane is preferentially oriented in a direction parallel to a film plane.

In addition, the underlying layer 1 has a structure close to amorphous, but may not be formed.

An antiferromagnetic layer 3 formed on the seed layer 2 is preferably made of an antiferromagnetic material containing Mn and an element X (X is at least one element or two elements of Pt, Pd, Ir, Rh, Ru and Os).

An X—Mn alloy using platinum has excellent characteristics such as excellent corrosion resistance and a high blocking temperature, and a high exchange coupling magnetic field (Hex).

In addition, in the present invention, the antiferromagnetic layer 3 may be made of an antiferromagnetic material containing Mn and elements X and X' (X' is at least one element or two elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and the rare earth elements).

The atomic % of the element X or the element X+X' of the antiferromagnetic layer 3 is preferably in a range from 45 (atomic %) to 60 (atomic %), and more preferably, in a range of 49 (atomic %) to 56.5 (atomic %). Accordingly, in a layer forming step, an interface between the antiferromagnetic layer 3 and a pinned magnetic layer 4 becomes a disconformable state and proper order transformation is caused in the antiferromagnetic layer 3 by a heating treatment.

The lower pinned magnetic layer 4 has a multilayer structure including a first pinned magnetic layer 4a, a non-magnetic intermediate layer 4b, and a second pinned magnetic layer 4c. The magnetization directions of the first pinned magnetic layer 4a and the second pinned magnetic layer 4c are antiparallel to each other due to an exchange coupling magnetic field of the interface between the antiferromagnetic layer 3 and the lower pinned magnetic layer 4 and an antiferromagnetic exchange coupling magnetic field (RKKY interaction) through the non-magnetic intermediate layer 4b. This is referred to as a laminated ferrimagnetic structure. By this configuration, the magnetization of the lower pinned magnetic layer 4 becomes stable and the exchange coupling magnetic field produced at the interface between the lower pinned magnetic layer 4 and the antiferromagnetic layer 3 can increases in appearance.

The lower pinned magnetic layer 4 may include only the second pinned magnetic layer 4c such that the laminated ferromagnetic structure is not formed.

In addition, the first pinned magnetic layer 4a has, for example, a thickness of 15 to 35 angstroms, the non-magnetic intermediate layer 4b has, for example, a thickness of 8 to 10 angstroms, and the second pinned magnetic layer 4c has, for example, a thickness of 20 to 60 angstroms.

The first pinned magnetic layer 4a is made of a ferromagnetic material such as CoFe, NiFe, or CoFeNi. In addition, the non-magnetic intermediate layer 4b is made of a non-magnetic conductive material such as Ru, Rh, Ir, Cr, Re, or Cu.

The second pinned magnetic layer 4c has a two-layer structure including a CoMnX alloy layer 4c1 contacting with a non-magnetic material layer 5 (element X is at least one element or two elements of Ge, Ga, In, Si, Pb, and Zn) and a magnetic layer 4c2 of the non-magnetic intermediate layer side. Furthermore, the magnetic layer 4c2 of the non-magnetic intermediate layer side is made of a ferromagnetic material such as NiFe, CoFeNi, or CoFe. In particular, both the first pinned magnetic layer 4a and the magnetic layer 4c2 of the non-magnetic intermediate layer side are preferably made of a CoFe alloy. Accordingly, the RKKY interaction which occurs between the non-magnetic intermediate layer 4c2 and the first pinned magnetic layer 4a can increase and the magnetizations of the first pinned magnetic layer 4a and the second pinned magnetic layer 4c can be strongly pinned.

The non-magnetic material layer 5 formed on the pinned magnetic layer 4 is made of Cu, Au, or Ag. The non-magnetic material layer 5 made of Cu, Au, or Ag has a face centered cubic structure (fcc) and an equivalent crystal plane which is represented as a (111) plane is preferentially oriented in a direction parallel to a film plane.

A free magnetic layer 6 is formed on the non-magnetic material layer 5. A non-magnetic material layer 7 is formed on the free magnetic layer 6 and the material thereof is selected from the materials used in the non-magnetic material layer 5. An upper pinned magnetic layer 8 is formed on the non-magnetic material layer 7. The upper pinned magnetic layer 8 has a laminated ferrimagnetic structure in which a second pinned magnetic layer 8c, a non-magnetic intermediate layer 8b, and a first pinned magnetic layer 8a are laminated in that order from the bottom. The materials of the first pinned magnetic layer 8a, the non-magnetic intermediate layer 8b, and the second pinned magnetic layer 8c are selected from the materials used in the first pinned magnetic layer 4a, the non-magnetic intermediate layer 4b, and the second pinned magnetic layer 4c, respectively. In addition, the second pinned magnetic layer 8c has a two-layer structure including a CoMnX alloy layer 8c1 contacting with the non-magnetic material layer 7 and a magnetic layer 8c2 of the non-magnetic intermediate layer side, similar to the second pinned magnetic layer 4c. Furthermore, the upper pinned magnetic layer 8 may include only the second pinned magnetic layer 8c.

An upper antiferromagnetic layer 9 is formed on the upper pinned magnetic layer 8. The material of the upper antiferromagnetic layer 9 is selected from the materials used in the lower antiferromagnetic layer 3. A protective layer 10 made of Ta is formed on the upper antiferromagnetic layer 9.

The free magnetic layer 6 is magnetized in a direction parallel to a track width direction (X direction shown in the drawing). The first pinned magnetic layers 4a and 8a and the second pinned magnetic layers 4c and 8c configuring the pinned magnetic layers 4 and 8 are magnetized in a direction parallel to a height direction (Y direction shown in the drawing). Since the pinned magnetic layers 4 and 8 have the laminated ferrimagnetic structure, the first pinned magnetic layers 4a and 8a and the second pinned magnetic layers 4c and 8c are magnetized in antiparallel to each other, respectively.

The first embodiment of the present invention is characterized in that the free magnetic layer 6 has a CoMnXZ alloy layer 6b. The CoMnXZ alloy layer is made of metal compound represented by a composition formula of $Co_gMn_hX_iZ_j$ (element X is at least one element or two elements of Ge, Ga, In, Si, Pb, and Zn, element Z is at least one element or two elements of Al, Sn, and Cr, g, h, i, and j are atomic %, and g+h+i+j=100 atomic %). In addition, g:h:i=2:1:1.

Since the free magnetic layer 6 has the CoMnXZ alloy layer 6b, the magnetostriction of the free magnetic layer 6 can be reduced.

A region in which the composition ratio of the element Z increases and a region in which the composition ratio of the element Z decreases alternately appears from the bottom to the top of the CoMnXZ alloy layer 6b.

In the present invention, when the atomic % concentration of the element Z in the CoMnXZ alloy layer is in a range of 3 atomic % to 15 atomic %, the magnetostriction can be greatly reduced and the large ΔRA of the magnetic detecting element can be maintained. Here, the "atomic % concentration of the element Z in the CoMnXZ alloy layer" is obtained by obtaining and averaging atomic % concentration of the element Z at a plurality of positions, for example, using a SIMS analysis device or the like.

As shown in FIG. 1, diffusion suppressing layers 6a and 6c made of a magnetic material are provided above and below the CoMnXZ alloy layer 6b. Accordingly, it is possible to suppress the element X in the CoMnXZ alloy layer 6b from being diffused into the non-magnetic material layers 5 and 7. The diffusion suppressing layers 6a and 6b are preferably made of a CoFe alloy. The diffusion suppressing layers 6a and 6b have a thickness sufficiently smaller than that of the CoMnXZ alloy layer 6b. The diffusion suppressing layers 6a and 6c have a thickness of few angstroms and the CoMnXZ alloy layer 6b has a thickness of 30 angstroms to 100 angstroms.

The element Z in the CoMnXZ alloy layer 6b may be entirely diffused from the bottom to the top of the CoMnXZ alloy layer 6b. Upon the composition analysis, the SIMS analysis device, a nano-beam EDX using a field-emission transmission electron microscopy (FE-TEM), and so on is used.

Figure 3:
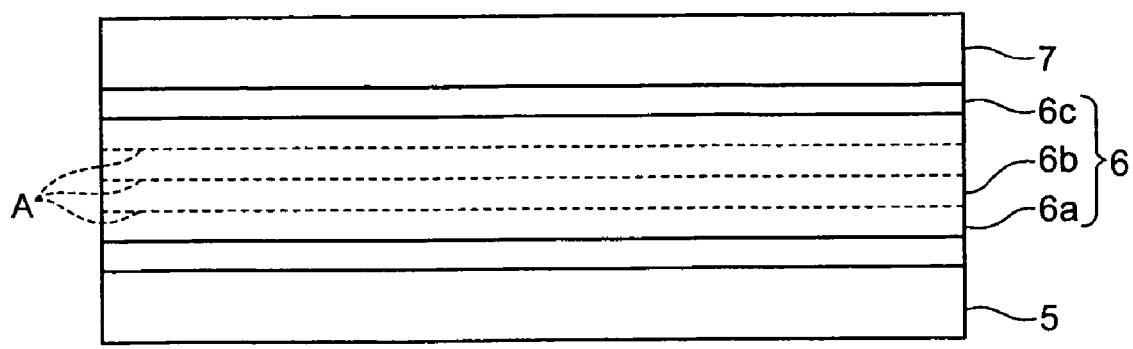
FIG. 3 is a partial enlarged view showing a layer structure from a CoMnXZ alloy layer of a lower pinned magnetic layer to a pinned magnetic layer of a non-magnetic material layer side of an upper pinned magnetic layer shown in FIG. 1.

FIG. 3 is a partial enlarged view showing a layer structure from the non-magnetic material layer 5 to the non-magnetic material layer 7 shown in FIG. 1.

Figure 4:
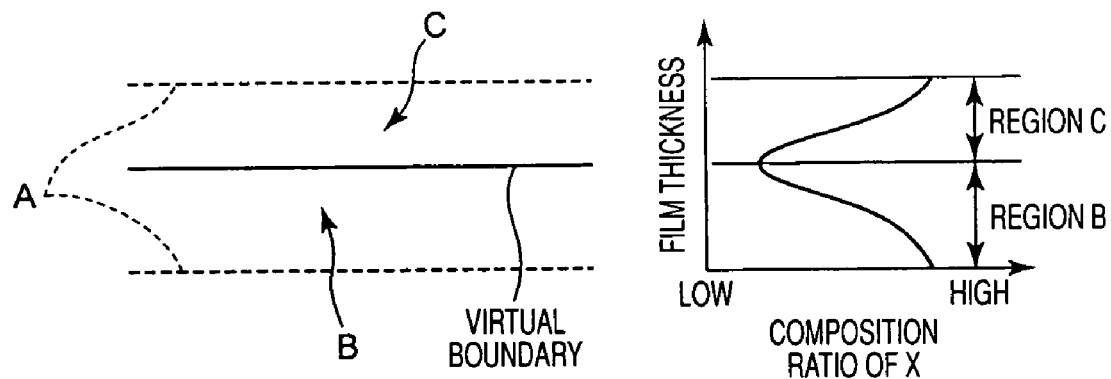
FIG. 4 is a partial enlarged view of the CoMnXZ layer shown in FIG. 3 and a graph illustrating composition modulation of an element Z in the CoMnXZ layer.

Dotted regions A shown in FIG. 3 show points where the composition ratio of the element Z is large in the CoMnXZ alloy layer 6b configuring the free magnetic layer 6. As can be seen from the below-described manufacturing method, the CoMnXZ alloy layer 6b has, for example, a laminated structure of a CoMnX alloy layer and a layer made of the element Z (element Z layer). It is considered that, due to the heat treatment or the like, the CoMnX alloy and the element Z are diffused, respectively. In the dotted regions A, the element Z layer was originally formed, but the CoMnXZ alloy layer is formed by the diffusion. The composition ratio of the element Z in the dotted regions A is larger than that of the element Z in the other region. As shown in FIG. 4 (a partial enlarged view of the CoMnXZ layer 6b of the free magnetic layer 6 shown in FIG. 3), when observing the composition ratio of the element Z in regions B and C between the two dotted regions A, in the region B, the composition ratio of the element Z becomes a maximum in the vicinity of the dotted region A and gradually decreases toward the region C (upper direction shown in the drawing). The composition ratio of the element Z becomes a minimum at a virtual boundary (this boundary does not actually exist) between the region C and the region B. In the region C, the composition ratio of the element Z gradually increases from the virtual boundary upward and becomes a maximum in the vicinity of the dotted region A. In other words, the region B represents a region in which the composition ratio of the element Z decreases upward and the region C represents a region in which the composition ratio of the element Z increases upward. The region B and the region C alternately appear in a film thickness direction. In addition, the element Z does not have 0 atomic % even in the vicinity of the virtual boundary in which the composition of the element Z becomes a minimum. The element Z may be entirely diffused from the bottom 6b1 to the top 6b2 of the CoMnXZ alloy layer 6b and a layer composed of only the element Z may remain.

Figure 2:
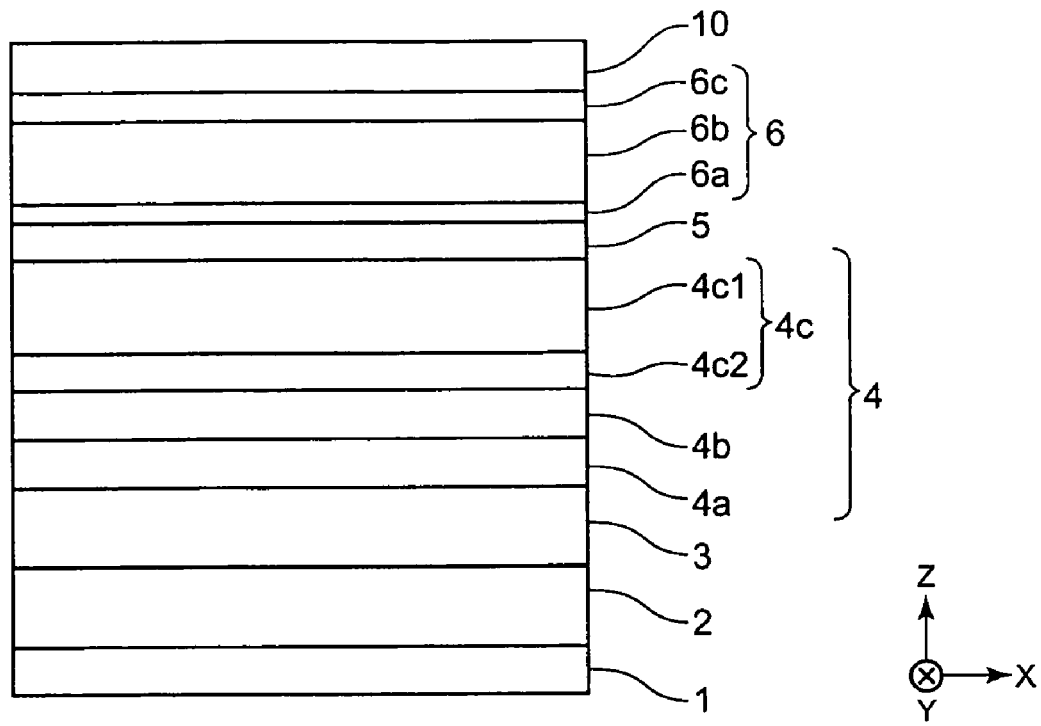
FIG. 2 is a view showing a structure of a magnetic detecting element (dual spin valve thin film element) according to a second embodiment of the present invention, as viewed from a surface facing a recording medium.

FIG. 2 is a view showing a layer structure of a CPP type single spin valve thin film element. The layers denoted by the same reference numerals as those of FIG. 1 denote the same layers as those of FIG. 1.

The CPP type single spin valve thin film element shown in FIG. 2 has a laminated structure in which an underlying layer 1, a seed layer 2, an antiferromagnetic layer 3, a pinned magnetic layer 4, a non-magnetic material layer 5, a free magnetic layer 6, and a protective layer 10 are laminated in that order from the bottom. Even in the CPP type single spin valve thin film element shown in FIG. 2, a CoMnXZ alloy layer 6b is provided in the free magnetic layer 6. In addition, the CPP type single spin valve thin film element may have laminated structure in which the free magnetic layer 6, the non-magnetic material layer 5, the pinned magnetic layer 4, and the antiferromagnetic layer 3 are laminated in that order from the bottom.

Figure 5:
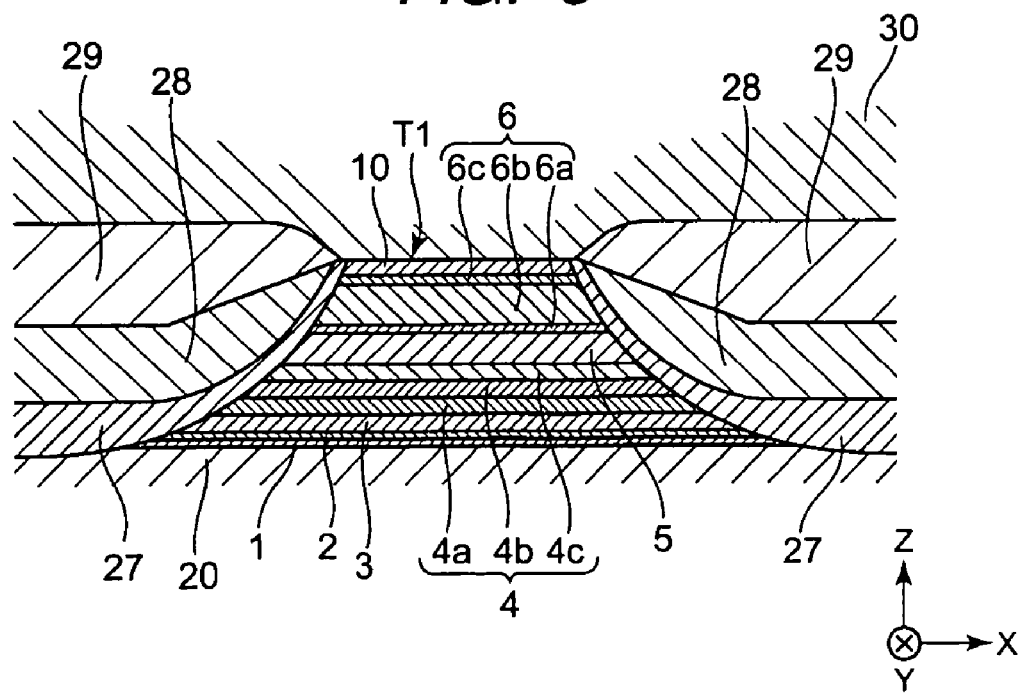
FIG. 5 is a partial cross-sectional view of a reproduction head having the structure of the magnetic detecting element shown in FIG. 2, as viewed from a surface facing the recording medium.

FIG. 5 is a partial cross-sectional view of a reproduction head having the structure of the CPP type single spin valve thin film element shown in FIG. 2, as view from a surface facing the recoding medium.

Reference numeral 20 is a lower shield layer 20 made of a magnetic material. A multilayer film T1 having the layer structure shown in FIG. 2 is formed on the lower shield layer 20.

The multilayer film T1 includes an underlying layer 1, a seed layer 2, an antiferromagnetic layer 3, a pinned magnetic layer 4, and a non-magnetic material layer 5, a free magnetic layer 6, and a protective layer 10, which are laminated in that order from the bottom. In the embodiment shown in FIG. 1, insulating layers 27, hard bias layers 28, and insulating layers 29 are laminated at the both sides of the multilayer film T1. The magnetization of the free magnetic layer 6 is aligned in the track width direction (X direction shown in the drawing) by a longitudinal bias magnetic field from the hard bias layers 28.

A bias underlying layer (not shown) may be formed between the insulating layer 27 and the hard bias layer 28. The bias underlying layer is, for example, made of Cr, W, W—Ti alloy, Fe—Cr alloy, or the like.

The insulating layers 27 and 29 are made of an insulating material such as $Al_2O_3$ or $SiO_2$. The top and the bottom of the hard bias layer 28 are insulated from each other such that the current flowing through the multilayer film T1 in a direction perpendicular to the interfaces between the layers are suppressed from being divided into the both sides in the track width direction of the multilayer film T1.

In addition, the hard bias layers 28 and 28 are made of a Co—Pt (cobalt-platinum) alloy or a Co—Cr—Pt (cobalt-chrome-platinum) alloy.

On the insulating layers 29 and the protective layer 10, an upper shield layer 30 made of a magnetic material is formed. In the CPP type spin valve thin film element, the lower shield layer 20 and the upper shield layer 30 function as electrodes and become current sources which flow the current in a direction perpendicular to the interfaces between the layers.

The magnetization of the free magnetic layer 6 is aligned in a direction parallel to the track width direction (X direction shown in the drawing) by the longitudinal bias magnetic field from the hard bias layers 28 and 28. In addition, the magnetization of the free magnetic layer 6 is preferably changed with respect to a signal magnetic field (external magnetic field) from the recording medium. The magnetization of the pinned magnetic layer 4 is pinned in a direction parallel to the height direction (Y direction shown in the drawing).

The electric resistance is changed by a relationship between the change in the magnetization direction of the free magnetic layer 6 and the pinned magnetization direction of the pinned magnetic layer 4 (particularly, the pinned magnetization direction of the second magnetic layer 4c), and a magnetic field leaked from the recording medium is detected by the voltage change or the current change based on the change in the electric resistance. The free magnetic layer 6 includes a CoMnXZ alloy layer 6b and diffusion suppressing layers 6a and 6c formed above and below the CoMnXZ alloy layer 6b. The second pinned magnetic layer 4c has a CoMn XZ alloy layer 4c1 and a magnetic layer 4c2 of the non-magnetic intermediate layer side.

Figure 6:
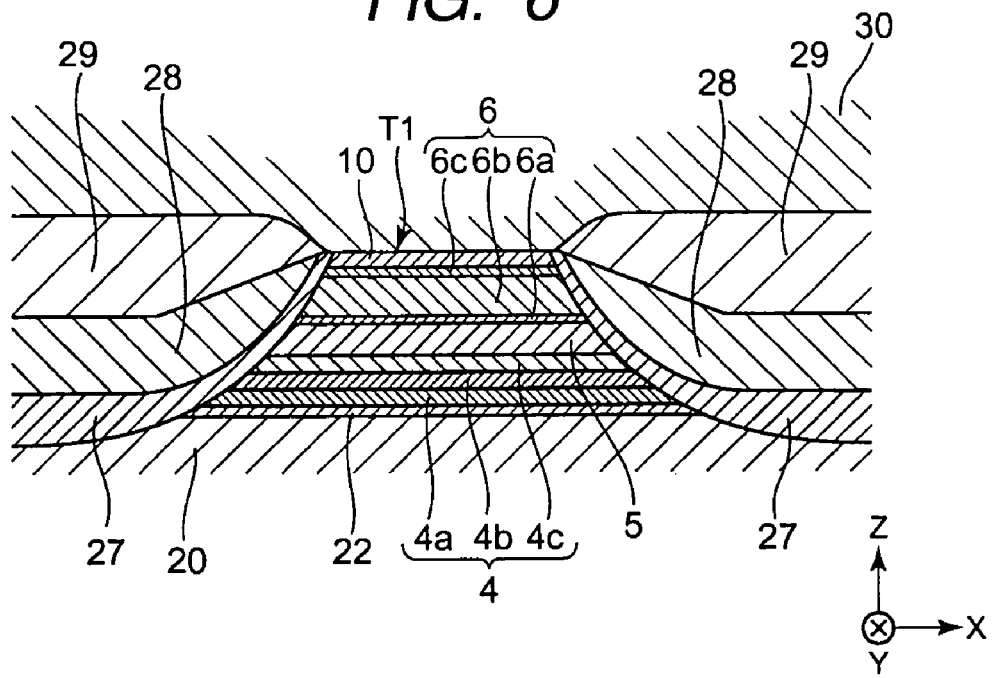
FIG. 6 is a partial cross-sectional view of a reproduction head having a structure of a magnetic detecting element different from the layer structure of FIG. 5.

FIG. 6 is a partial cross-sectional view of a reproduction head having a layer structure of a magnetic detecting element different from the layer structure of FIG. 5, as viewed from a surface facing a recording medium.

In FIG. 6, the antiferromagnetic layer 3 is not provided, unlike FIG. 5. FIG. 6 shows the so-called self-pinned magnetic detecting element in which the magnetization of the pinned magnetic layer 4 is pinned by uniaxial anisotropy of the pinned magnetic layer.

In FIG. 6, a magnetostriction increasing layer 22 made of an alloy composed of one element or two elements of Pt, Au, Pd, Ag, Ir, Rh, Ru, Re, Mo, and W or a R—Mn alloy (element R is one element or two elements of Pt, Pd, Ir, Rh, Ru, Os, Ni, and Fe) is formed below the pinned magnetic layer 4 with a thickness of 5 angstroms to 50 angstroms.

By increasing the magnetostriction constant λs of the pinned magnetic layer 4, the magnetoelastic energy increases and thus the uniaxial anisotropy of the pinned magnetic layer 4 increases. When the uniaxial anisotropy of the pinned magnetic layer 4 increases, the magnetization of the pinned magnetic layer 4 is strongly pinned in a predetermined direction and thus the output of the magnetic detecting element increases and the stability or the symmetry of the output are improved.

In the magnetic detecting element shown in FIG. 6, the magnetostriction increasing layer 22 made of non-magnetic metal contacting with the first pinned magnetic layer 4a is provided on the first pinned magnetic layer 4a configuring the pinned magnetic layer 4 at the side opposite to the non-magnetic material layer 5. Accordingly, distortion occurs in the crystal structure of the lower surface of the first pinned magnetic layer 4a and thus the magnetostriction constant λs of the first pinned magnetic layer 4a increases. Thus, the uniaxial anisotropy of the pinned magnetic layer 4 increases and thus the pinned magnetic layer 4 can be strongly pinned in a direction parallel to the height direction (X direction shown in the drawing) although the antiferromagnetic layer 3 is not formed.

The free magnetic layer 6 includes a CoMnXZ alloy layer 6b and diffusion suppressing layers 6a and 6c formed above and below the CoMnXZ alloy layer 6b. The second pinned magnetic layer 4c has a CoMnXZ alloy layer 4c1 and a magnetic layer 4c2 of the non-magnetic intermediate layer side.

Although the single spin valve thin film element is described with reference to FIGS. 5 and 6, the dual spin valve thin film element shown in FIG. 1 may have the same layer structure.

Figure 7:
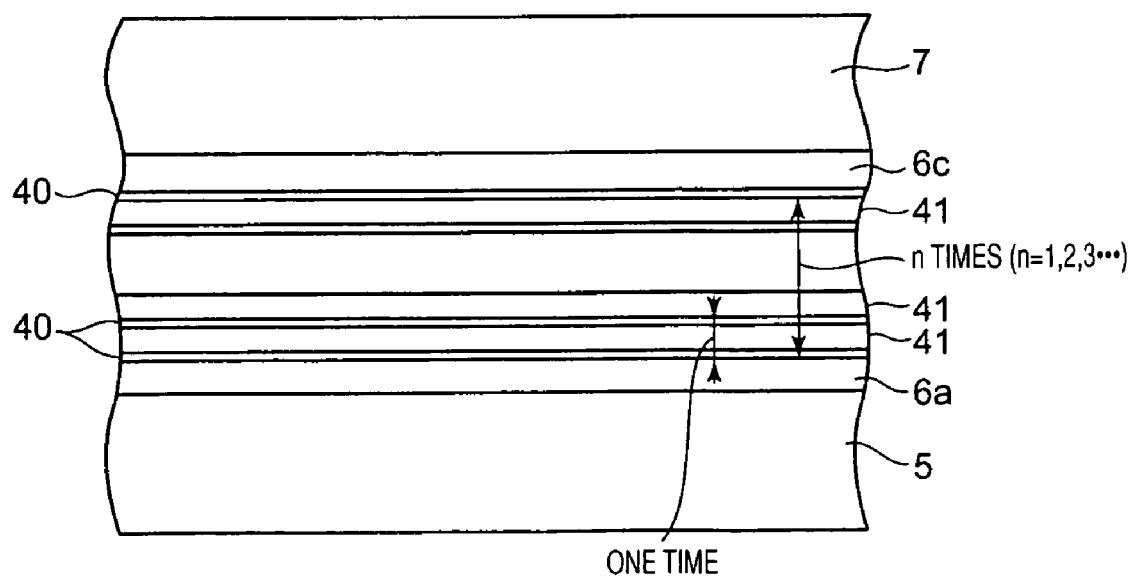
FIG. 7 is a view showing steps of a method of manufacturing the dual spin valve thin film element shown in FIG. 1.
Figure 8:
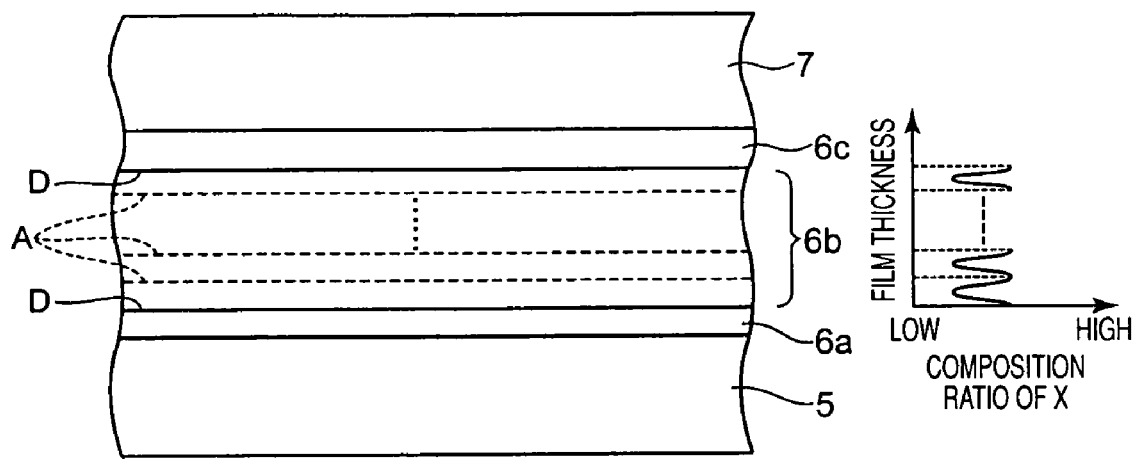
FIG. 8 is a view showing steps which are performed after the steps shown in FIG. 7.

FIGS. 7 and 8 show steps of a method of manufacturing the dual spin valve thin film element shown in FIG. 1 and are partial enlarged views showing the layer structure of the dual spin valve thin film element in a manufacturing process.

First, an underlying layer 1, a seed layer 2, an antiferromagnetic layer 3, a pinned magnetic layer 4, and a non-magnetic material layer 5 are formed by sputtering or deposition. The materials of these layers were described with reference to FIG. 1.

As shown in FIG. 7, a diffusion suppressing layer 6a is formed on the non-magnetic material layer 5 by sputtering or deposition. The diffusion suppressing layer 6a is, for example, made of a CoFe alloy. An element Z layer 40 made of the element Z (the element Z is at least one element or two elements selected from Al, Sn, and Cr) is formed on the diffusion suppressing layer 6a with a small thickness by sputtering or deposition. In addition, a CoMnX alloy layer 41 is formed on the element Z layer 40 by sputtering or deposition. The CoMnX alloy layer 41 is made of metal compound represented by a composition formula of $Co_gMn_hX_i$ (element X is at least one element or two elements of Ge, Ga, In, Si, Pb, and Zn, g+h+i=100 atomic %, and g:h:i=2:1:1). The thickness of the CoMnX alloy layer 41 is larger than that of the element Z layer 40. When a laminated structure in which the element Z layer 40 and the CoMnX alloy layer 41 are laminated one time forms a unit (the number of times of lamination is one time), the lamination is performed n times (n=1, 2, ... ). The element Z layer 40 is formed on the CoMnX alloy layer 41 formed at an uppermost side and a diffusion suppressing layer 6c is formed on the element Z layer 40 by sputtering or deposition. The diffusion suppressing layer 6c is, for example, made of a CoFe alloy.

Next, a non-magnetic material layer 7 is formed on the diffusion suppressing layer 6c by sputtering or deposition, and a pinned magnetic layer 8, an antiferromagnetic layer 9, and a protective layer 10 are formed by sputtering or deposition.

After the underlying layer 1 to the protective layer 10 are laminated, a heat treatment (290° C. and 3.5 hours) is performed. Accordingly, an exchange coupling magnetic field is produced between the antiferromagnetic layers 3 and 9 and the first pinned magnetic layers 4a and 8a configuring the pinned magnetic layers 4 and 8, and the first pinned magnetic layers 4a and 8a are magnetized in a direction parallel to the height direction (Y direction shown in the drawing). In addition, the second pinned magnetic layers 4c and 8c are magnetized in a direction antiparallel to the magnetization directions of the first pinned magnetic layers 4a and 8a by the RKKY interaction between the first pinned magnetic layers 4a and 8a and the second pinned magnetic layers 4c and 8c.

By the heat treatment, diffusion occurs in the element Z layer 40 and the CoMnX alloy layer 41 in the CoMnXZ alloy layer 6b in the free magnetic layer 6. In dotted regions A shown in FIG. 8, before the heat treatment, the composition ratio of the element Z in the region in which the element Z layer 40 was formed is apt to more increase than that of the other region by the diffusion due to the heat treatment, as shown in the right side of the drawing. The composition modulation that the composition ratio of the element Z repeatedly increases and decreases toward the film thickness direction (X direction shown in the drawing) in the free magnetic layer 6 may occur, as shown in the right side of the drawing. As shown in FIG. 7, since the element Z layer 40 is provided even between the diffusion suppressing layers 6a and 6c and the CoMnX alloy layer 41, the composition ratio of the element Z is apt to become larger in an interface region D between the diffusion suppressing layers 6a and 6c as well as the dotted regions A (FIG. 8). In addition, it is expected that a portion of the element Z is diffused into even the diffusion suppressing layers 6a and 6c.

In order to facilitate the diffusion, the thickness of the element Z layer 40 is preferably in a range from 1.0 angstroms to 3.0 angstroms. In addition, when the element Z layer 40 is thick, the magnetostriction can be reduced, but the ΔRA is greatly reduced. Accordingly, it is important that the thickness ratios of the element Z layer 40 and the CoMnX alloy layer 41 are controlled. In the present invention, when a laminated structure in which the element Z layer 40 and the CoMnX alloy layer 41 are laminated one time forms a unit and the thickness ratio of the element Z layer 40 in the unit is represented by [thickness of the element Z layer 40/(thickness of CoMnX alloy layer+thickness of the element Z layer 40)]×100(%), the thickness ratio of the element Z layer is preferably in a range from 8% to 20%. By setting the element Z layer 40 and the CoMnX alloy layer 41 to the above-mentioned thickness ratios, an average composition ratio of the element Z in the alloyed CoMnXZ alloy layer 6b can be controlled in a range from 3 atomic % to 15 atomic %. In addition, the thickness of the CoMnX alloy layer is preferably in a range from 10 angstroms to 40 angstroms.

In the method of manufacturing the CPP type spin valve thin film element shown in FIGS. 7 and 8, the element Z layer 40 and the CoMnX alloy layer 41 are alternately laminated to form the free magnetic layer 6 such that the CPP type spin valve thin film element capable of increasing ΔRA and reducing the magnetostriction of the free magnetic layer 6 can be formed using a simple manufacturing method, without changing the existing manufacturing equipments.

In the present invention, the CoMnXZ alloy layer 6b may be formed using a target composed of an element CoMnXZ. Furthermore, the free magnetic layer 6 may be composed of only the CoMnXZ alloy layer 6b, the second pinned magnetic layer 4c may be composed of only the CoMnX alloy layer 4c1, and the second pinned magnetic layer 8c may be composed of only the CoMnX alloy layer 8c1.

Next, characteristic portions of a second embodiment will be described.

In addition, the second embodiment is characterized in that the free magnetic layer 6 has a CoMnXRh alloy layer 6b. The CoMnXRh alloy layer is made of metal compound represented by a composition formula of $Co_gMn_hX_iRh_j$ (element X is at least one element or two elements of Ge, Ga, In, Si, Pb, Zn, Sn, Al, and Sb, g, h, i, and j are atomic %, and g+h+i+j=100 atomic %). In addition, g:h:i=2:1:1.

Since the free magnetic layer 6 has the CoMnXRh alloy layer 6b, the magnetostriction of the free magnetic layer 6 can be reduced.

A region in which the composition ratio of the element Rh increases and a region in which the composition ratio of the element Rh decreases alternately appears from the bottom to the top of the CoMnXRh alloy layer 6b.

When the atomic % concentration of the element Rh in the CoMnXRh alloy layer is in a range of 4 atomic % to 10 atomic %, and more particularly, in a range of 7 atomic % to 10 atomic %, the magnetostriction can be greatly reduced and the large ΔRA of the magnetic detecting element can be maintained. Here, the "atomic % concentration of the element Rh in the CoMnXRh alloy layer" is obtained by obtaining and averaging atomic % concentration of the element Rh at a plurality of positions, for example, using a SIMS analysis device or the like.

As shown in FIG. 1, diffusion suppressing layers 6a and 6c made of a magnetic material are provided above and below the CoMnXRh alloy layer 6b. Accordingly, it is possible to suppress the element X in the CoMnXRh alloy layer 6b from being diffused into the non-magnetic material layers 5 and 7. The diffusion suppressing layers 6a and 6b are preferably made of a CoFe alloy. The diffusion suppressing layers 6a and 6b have a thickness sufficiently smaller than that of the CoMnXRh alloy layer 6b. The diffusion suppressing layers 6a and 6c have a thickness of few angstroms and the CoMnXRh alloy layer 6b has a thickness of 30 angstroms to 100 angstroms.

The element Rh in the CoMnXRh alloy layer 6b may be entirely diffused from the bottom to the top of the CoMnXRh alloy layer 6b. Upon the composition analysis, the SIMS analysis device, a nano-beam EDX using a field-emission transmission electron microscopy (FE-TEM), and so on is used.

FIG. 3 is a partial enlarged view showing a layer structure from the non-magnetic material layer 5 to the non-magnetic material layer 7 shown in FIG. 1.

Dotted regions A shown in FIG. 3 show points where the composition ratio of the element Rh is large in the CoMnXRh alloy layer 6b configuring the free magnetic layer 6. As can be seen from the below-described manufacturing method, the CoMnXRh alloy layer 6b has, for example, a laminated structure of a CoMnX alloy layer and a layer made of the element Rh (element Rh layer). It is considered that, due to the heat treatment or the like, the CoMnX alloy and the element Rh are diffused, respectively. In the dotted regions A, the element Rh layer was originally formed, but the CoMnXRh alloy layer is formed by the diffusion. The composition ratio of the element Rh in the dotted regions A is larger than that of the element Rh in the other region. As shown in FIG. 4 (a partial enlarged view of the CoMnXRh layer 6b of the free magnetic layer 6 shown in FIG. 3), when observing the composition ratio of the element Rh in regions B and C between the two dotted regions A, in the region B, the composition ratio of the element Rh becomes a maximum in the vicinity of the dotted region A and gradually decreases toward the region C (upper direction shown in the drawing). The composition ratio of the element Rh becomes a minimum at a virtual boundary (this boundary does not actually exist) between the region C and the region B. In the region C, the composition ratio of the element Rh gradually increases from the virtual boundary upward and becomes a maximum in the vicinity of the dotted region A. In other words, the region B represents a region in which the composition ratio of the element Rh decreases upward and the region C represents a region in which the composition ratio of the element Rh increases upward. The region B and the region C alternately appear in a film thickness direction. In addition, the element Rh does not have 0 atomic % even in the vicinity of the virtual boundary in which the composition of the element Rh becomes a minimum. The element Rh may be entirely diffused from the bottom 6b1 to the top 6b2 of the CoMnXRh alloy layer 6b and a layer composed of only the element Rh may remain.

FIG. 2 is a view showing a layer structure of a CPP type single spin valve thin film element. The layers denoted by the same reference numerals as those of FIG. 1 denote the same layers as those of FIG. 1.

The CPP type single spin valve thin film element shown in FIG. 2 has a laminated structure in which an underlying layer 1, a seed layer 2, an antiferromagnetic layer 3, a pinned magnetic layer 4, a non-magnetic material layer 5, a free magnetic layer 6, and a protective layer 10 are laminated in that order from the bottom. Even in the CPP type single spin valve thin film element shown in FIG. 2, a CoMnXRh alloy layer 6b is provided in the free magnetic layer 6, and a CoMnX alloy layer 4c1 (X is at least one element or two elements of Ge, Ga, In, Si, Pb, Zn, Sn, Al, and Sb) is provided in the second pinned magnetic layer 4c. In addition, the CPP type single spin valve thin film element may have laminated structure in which the free magnetic layer 6, the non-magnetic material layer 5, the pinned magnetic layer 4, and the antiferromagnetic layer 3 are laminated in that order from the bottom.

FIG. 5 is a partial cross-sectional view of a reproduction head having the structure of the CPP type single spin valve thin film element shown in FIG. 2, as view from a surface facing the recoding medium.

Reference numeral 20 is a lower shield layer 20 made of a magnetic material. A multilayer film T1 having the layer structure shown in FIG. 2 is formed on the lower shield layer 20.

The multilayer film T1 includes an underlying layer 1, a seed layer 2, an antiferromagnetic layer 3, a pinned magnetic layer 4, and a non-magnetic material layer 5, a free magnetic layer 6, and a protective layer 10, which are laminated in that order from the bottom. In the embodiment shown in FIG. 5, insulating layers 27, hard bias layers 28, and insulating layers 29 are laminated at the both sides of the multilayer film T1. The magnetization of the free magnetic layer 6 is oriented in the track width direction (X direction shown in the drawing) by a longitudinal bias magnetic field from the hard bias layers 28.

A bias underlying layer (not shown) may be formed between the insulating layer 27 and the hard bias layer 28. The bias underlying layer is, for example, made of Cr, W, W—Ti alloy, Fe—Cr alloy, or the like.

The insulating layers 27 and 29 are made of an insulating material such as $Al_2O_3$ or $SiO_2$. The top and the bottom of the hard bias layer 28 are insulated from each other such that the current flowing through the multilayer film T1 in a direction perpendicular to the interfaces between the layers are suppressed from being divided into the both sides in the track width direction of the multilayer film T1.

In addition, the hard bias layers 28 and 28 are made of a Co—Pt (cobalt-platinum) alloy or a Co—Cr—Pt (cobalt-chrome-platinum) alloy.

On the insulating layers 29 and the protective layer 10, an upper shield layer 30 made of a magnetic material is formed. In the CPP type spin valve thin film element, the lower shield layer 20 and the upper shield layer 30 function as electrodes and become current sources which flow the current in a direction perpendicular to the interfaces between the layers.

The magnetization of the free magnetic layer 6 is aligned in a direction parallel to the track width direction (X direction shown in the drawing) by the longitudinal bias magnetic field from the hard bias layers 28 and 28. In addition, the magnetization of the free magnetic layer 6 is preferably changed with respect to a signal magnetic field (external magnetic field) from the recording medium. The magnetization of the pinned magnetic layer 4 is pinned in a direction parallel to the height direction (Y direction shown in the drawing).

The electric resistance is changed by a relationship between the change in the magnetization direction of the free magnetic layer 6 and the pinned magnetization direction of the pinned magnetic layer 4 (particularly, the pinned magnetization direction of the second magnetic layer 4c) and a magnetic field leaked from the recording medium is detected by the voltage change or the current change based on the change in the electric resistance. The free magnetic layer 6 includes a CoMnXRh alloy layer 6b and diffusion suppressing layers 6a and 6c formed above and below the CoMnXRh alloy layer 6b. The second pinned magnetic layer 4c has a CoMnX alloy layer 4c1 and a magnetic layer 4c2 of the non-magnetic intermediate layer side.

FIG. 6 is a partial cross-sectional view of a reproduction head having a layer structure of a magnetic detecting element different from the layer structure of FIG. 5, as viewed from a surface facing a recording medium.

In FIG. 6, the antiferromagnetic layer 3 is not provided, unlike FIG. 5. FIG. 6 shows the so-called self-pinned magnetic detecting element in which the magnetization of the pinned magnetic layer 4 is pinned by uniaxial anisotropy of the pinned magnetic layer.

In FIG. 6, a magnetostriction increasing layer 22 made of an alloy composed of one element or two elements of Pt, Au, Pd, Ag, Ir, Rh, Ru, Re, Mo, and W or a R—Mn alloy (element R is one element or two elements of Pt, Pd, Ir, Rh, Ru, Os, Ni, and Fe) is formed below the pinned magnetic layer 4 with a thickness of 5 angstroms to 50 angstroms.

By increasing the magnetostriction constant λs of the pinned magnetic layer 4, the magnetoelastic energy increases and thus the uniaxial anisotropy of the pinned magnetic layer 4 increases. When the uniaxial anisotropy of the pinned magnetic layer 4 increases, the magnetization of the pinned magnetic layer 4 is strongly pinned in a predetermined direction and thus the output of the magnetic detecting element increases and the stability or the symmetry of the output are improved.

In the magnetic detecting element shown in FIG. 6, the magnetostriction increasing layer 22 made of non-magnetic metal contacting with the first pinned magnetic layer 4a is provided on the first pinned magnetic layer 4a configuring the pinned magnetic layer 4 at the side opposite to the non-magnetic material layer 5. Accordingly, distortion occurs in the crystal structure of the lower surface of the first pinned magnetic layer 4a and thus the magnetostriction constant λs of the first pinned magnetic layer 4a increases. Thus, the uniaxial anisotropy of the pinned magnetic layer 4 increases and thus the pinned magnetic layer 4 can be strongly pinned in a direction parallel to the height direction (X direction shown in the drawing) although the antiferromagnetic layer 3 is not formed.

The free magnetic layer 6 includes a CoMnXRh alloy layer 6b and diffusion suppressing layers 6a and 6c formed above and below the CoMnXRh alloy layer 6b. The second pinned magnetic layer 4c has a CoMnX alloy layer 4c1 and a magnetic layer 4c2 of the non-magnetic intermediate layer side.

Although the single spin valve thin film element is described with reference to FIGS. 5 and 6, the dual spin valve thin film element shown in FIG. 1 may have the same layer structure.

FIGS. 7 and 8 show steps of a method of manufacturing the dual spin valve thin film element shown in FIG. 1 and are partial enlarged views showing the layer structure of the dual spin valve thin film element in a manufacturing process.

First, an underlying layer 1, a seed layer 2, an antiferromagnetic layer 3, a pinned magnetic layer 4, and a non-magnetic material layer 5 are formed by sputtering or deposition. The materials of these layers were described with reference to FIG. 1.

As shown in FIG. 7, a diffusion suppressing layer 6a is formed on the non-magnetic material layer 5 by sputtering or deposition. The diffusion suppressing layer 6a is, for example, made of a CoFe alloy. An element Rh layer 40 is formed on the diffusion suppressing layer 6a with a small thickness by sputtering or deposition. In addition, a CoMnX alloy layer 41 is formed on the element Rh layer 40 by sputtering or deposition. The CoMnX alloy layer 41 is made of metal compound represented by a composition formula of $Co_gMn_hX_i$ (element X is at least one element or two elements of Ge, Ga, In, Si, Pb, Zn, Sn, Al, and Sb, g+h+i=100 atomic %, and g:h:i=2:1:1). The thickness of the CoMnX alloy layer 41 is larger than that of the element Rh layer 40. When a laminated structure in which the element Rh layer 40 and the CoMnX alloy layer 41 are laminated one time forms a unit (the number of times of lamination is one time), the lamination is performed n times (n=1, 2, ... ). The element Rh layer 40 is formed on the CoMnX alloy layer 41 formed at an uppermost side and a diffusion suppressing layer 6c is formed on the element Rh layer 40 by sputtering or deposition. The diffusion suppressing layer 6c is, for example, made of a CoFe alloy.

Next, a non-magnetic material layer 7 is formed on the diffusion suppressing layer 6c by sputtering or deposition, and a pinned magnetic layer 8, an antiferromagnetic layer 9, and a protective layer 10 are formed by sputtering or deposition.

After the underlying layer 1 to the protective layer 10 are laminated, a heat treatment (290° C. and 3.5 hours) is performed. Accordingly, an exchange coupling magnetic field is produced between the antiferromagnetic layers 3 and 9 and the first pinned magnetic layers 4a and 8a configuring the pinned magnetic layers 4 and 8, and the first pinned magnetic layers 4a and 8a are magnetized in a direction parallel to the height direction (Y direction shown in the drawing). In addition, the second pinned magnetic layers 4c and 8c are magnetized in a direction antiparallel to the magnetization directions of the first pinned magnetic layers 4a and 8a by the RKKY interaction between the first pinned magnetic layers 4a and 8a and the second pinned magnetic layers 4c and 8c.

By the heat treatment, diffusion occurs in the element Rh layer 40 and the CoMnX alloy layer 41 in the CoMnXRh alloy layer 6b in the free magnetic layer 6. In dotted regions A shown in FIG. 8, before the heat treatment, the composition ratio of the element Rh in the region in which the element Rh layer 40 is formed is apt to more increase than that of the other region by the diffusion due to the heat treatment, as shown in the right side of the drawing. The composition modulation that the composition ratio of the element Rh repeatedly increases and decreases toward the film thickness direction (X direction shown in the drawing) in the free magnetic layer 6 may occur, as shown in the right side of the drawing. As shown in FIG. 7, since the element Rh layer 40 is provided even between the diffusion suppressing layers 6a and 6c and the CoMnX alloy layer 41, the composition ratio of the element Rh is apt to become larger in an interface region D between the diffusion suppressing layers 6a and 6c as well as the dotted regions A (FIG. 8). In addition, it is expected that a portion of the element Rh is diffused into even the diffusion suppressing layers 6a and 6c.

In order to facilitate the diffusion, the thickness of the element Rh layer 40 is preferably in a range from 1.0 angstroms to 3.0 angstroms. The thickness of the element Rh layer 40 is more preferably in a range from 2.0 angstroms to 3.0 angstroms. In addition, when the element Rh layer 40 is thick, the magnetostriction can be reduced, but the ΔRA is greatly reduced. Accordingly, it is important that the thickness ratios of the element Rh layer 40 and the CoMnX alloy layer 41 are controlled. In the present invention, when a laminated structure in which the element Rh layer 40 and the CoMnX alloy layer 41 are laminated one time forms a unit and the thickness ratio of the element Rh layer 40 in the unit is represented by [thickness of the element Rh layer 40/(thickness of CoMnX alloy layer+thickness of the element Rh layer 40)]×100(%), the thickness ratio of the element Rh layer is preferably in a range from 4% to 13%.

In addition, the thickness of the CoMnX alloy layer 41 is preferably in a range from 10 angstroms to 40 angstroms.

By setting the element Rh layer 40 and the CoMnX alloy layer 41 to the above-mentioned thickness ratios, an average composition ratio of the element Rh in the alloyed CoMnXRh alloy layer 6b can be controlled in a range from 4 atomic % to 10 atomic % or from 7 atomic % to 10 atomic %.

In the method of manufacturing the CPP type spin valve thin film element shown in FIGS. 7 and 8, the element Rh layer 40 and the CoMnX alloy layer 41 are alternately laminated to form the free magnetic layer 6 such that the CPP type spin valve thin film element capable of increasing ΔRA and reducing the magnetostriction of the free magnetic layer 6 can be formed using a simple manufacturing method, without changing the existing manufacturing equipments.

In the present invention, the CoMnXRh alloy layer 6b may be formed using a target composed of an element CoMnXRh. Furthermore, the free magnetic layer 6 may be composed of only the CoMnXRh alloy layer 6b, the second pinned magnetic layer 4c may be composed of only the CoMnX alloy layer 4c1, and the second pinned magnetic layer 8c may be composed of only the CoMnX alloy layer 8c1.

EMBODIMENT 1

A dual spin valve thin film element having the following layer structure was manufactured.

A basic layer structure was as follows: underlying layer 1; Ta (30)/seed layer 2; NiFeCr (50)/lower antiferromagnetic layer 3; IrMn (70)/lower pinned magnetic layer 4 [first magnetic layer 4a; FeCo (30)/non-magnetic intermediate layer 4b; Ru (9.1)/magnetic layer 4c2 of the non-magnetic intermediate layer side; FeCo (10)/CoMnX alloy 4c1; CoMnGe (40)]/non-magnetic material layer 5; Cu (50)/free magnetic layer 6/non-magnetic material layer 7; Cu (50)/upper pinned magnetic layer 8[CoMnX alloy layer 8c1; CoMnGe (40)/ magnetic layer 8c2 of the non-magnetic intermediate layer side; FeCo (10)/non-magnetic intermediate layer 8b; Ru (9.1)/first pinned magnetic layer 8a; FeCo (30)]/upper antiferromagnetic layer 9; IrMn(70)/protective layer 10; Ta (200). In addition, numerals in parentheses denote the thicknesses and the unit thereof is angstrom.

In an experiment, the following samples having various laminated structures of the free magnetic layer 6 (before the heat treatment) were prepared. The laminated structures of the free magnetic layer 6 of the samples are as follows.

SAMPLE 1: COMPARATIVE EXAMPLE 1

CoMnGe(100)

SAMPLE 2: COMPARATIVE EXAMPLE 2

CoMnGe(14)/PtMn(2)/[CoMnGe(12)/PtMn(2)]×6/CoMnGe(14)

SAMPLE 3: COMPARATIVE EXAMPLE 3

CoMnGe(14)/IrMn(2)/[CoMnGe(12)/IrMn(2)]×6/CoMnGe(14)

SAMPLE 4: COMPARATIVE EXAMPLE 4

CoMnGe(14)/Ru(2)/[CoMnGe(12)/Ru(2)]×6/CoMnGe(14)

SAMPLE: EXAMPLE 1

CoMnGe(14)/Al(2)/[CoMnGe(12)/Al(2)]×6/CoMnGe(14)

SAMPLE: EXAMPLE 2

CoMnGe(14)/Cr(2)/[CoMnGe(12)/Cr(2)]×6/CoMnGe(14)

SAMPLE: EXAMPLE 3

CoMnGe(14)/Sn(2)/[CoMnGe(12)/Sn(2)]×6/CoMnGe(14)

The numerals in parentheses of the laminated structures of the free magnetic layer represent the thickness (angstrom). In addition, "×6" denotes that the layer structure is laminated 6 times. Furthermore, in every sample, the composition ratio among the element Co, the element Mn, and the element Ge in the CoMnGe is 2:1:1.

After the samples are formed, the samples are subjected to the heat treatment.

Next, the magnetostriction constants λs of the free magnetic layers measured after the heat treatment of the samples and ΔRS of the samples were measured. The result is shown in FIG. 9.

Figure 9:
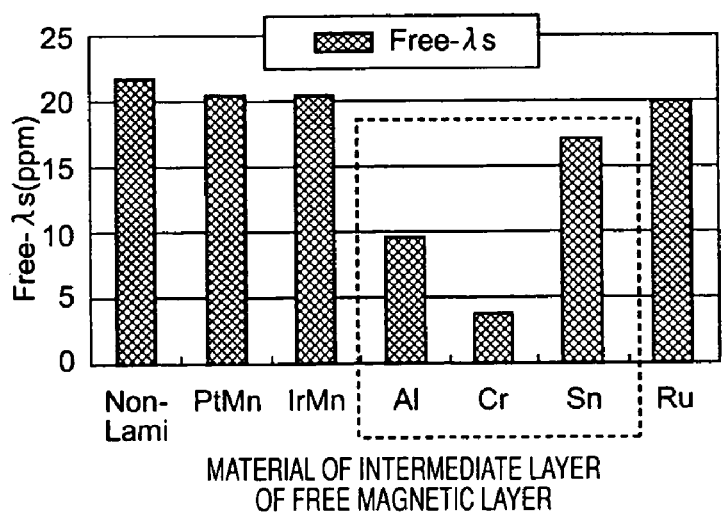
FIG. 9 is a graph showing a relationship between the composition of a free magnetic layer and a magnetostriction constant $\lambda S$.

As shown in FIG. 9, the magnetostriction constants λs of the free magnetic layers of the comparative examples 2, 3, and 4, which are composed of a laminate of a CoMnGe alloy layer and a PtMn alloy layer, a laminate of a CoMnGe alloy layer and a IrMn alloy layer, and a laminate of a CoMnGe alloy layer and a Ru layer, respectively, are substantially similar to the magnetostriction constant λs of the free magnetic layer composed of only a CoMnGe alloy.

In contrast, the magnetostriction constants λs of the free magnetic layers of the examples 1, 2, and 3, which are composed of a laminate of a CoMnGe alloy layer and a Al layer, a laminate of a CoMnGe alloy layer and a Cr layer, and a laminate of a CoMnGe alloy layer and a Sn layer, respectively, are more reduced than the magnetostriction constant λs of the free magnetic layer composed of only a CoMnGe alloy.

In addition, the ΔRS of the magnetic detecting element of the example 1 composed of the laminate of the CoMnGe alloy layer and the Al layer is 5.8 mΩ·μm$^2$, and the ΔRS of the magnetic detecting element of the example 3 composed of the laminate of the CoMnGe alloy layer and the Sn layer is 7.0 mΩ·μm$^2$, which are larger than 5.0 mΩ·μm$^2$ required for the CPP type magnetic detecting element.

EMBODIMETN 2

A dual spin valve thin film element having the following layer structure was manufactured.

A basic layer structure was as follows: underlying layer 1; Ta (30)/seed layer 2; NiFeCr (50)/lower antiferromagnetic layer 3; IrMn (70)/lower pinned magnetic layer 4 [first magnetic layer 4a; FeCo (30)/non-magnetic intermediate layer 4b; Ru (9.1)/magnetic layer 4c2 of the non-magnetic intermediate layer side; FeCo (10)/CoMnX alloy layer 4c1; CoMnGe (40)]/non-magnetic material layer 5; Cu (50)/free magnetic layer 6/non-magnetic material layer 7; Cu (50)/upper pinned magnetic layer 8[CoMnX alloy layer 8c1; CoMnGe (40)/magnetic layer 8c2 of the non-magnetic intermediate layer side; FeCo (10)/non-magnetic intermediate layer 8b; Ru (9.1)/first pinned magnetic layer 8a; FeCo (30)]/upper antiferromagnetic layer 9; IrMn (70)/protective layer 10; Ta (200). In addition, numerals in parentheses denote the thicknesses and the unit thereof is angstrom.

In an experiment, various magnetic detecting elements in which a laminated structure of the free magnetic layer 6 (before the heat treatment) is CoMnGe(14)/Al(x)/[CoMnGe(12)/Al(x)]×6/CoMnGe(14) and the Al layer has various thickness x (angstrom) were subjected to the heat treatment and a relationship between the atomic % concentration of the element Al in the free magnetic layer and the magnetostriction constant λs of the free magnetic layer and a relationship between the atomic % concentration of the element Al in the free magnetic layer and ΔRS of the magnetic detecting element were examined.

The numerals in parentheses of the laminated structures of the free magnetic layer represent the thickness (angstrom). In addition, "×6" denotes that the layer structure is laminated 6 times. Furthermore, in every sample, the composition ratio among the element Co, the element Mn, and the element Ge in the CoMnGe is 2:1:1.

Figure 10:
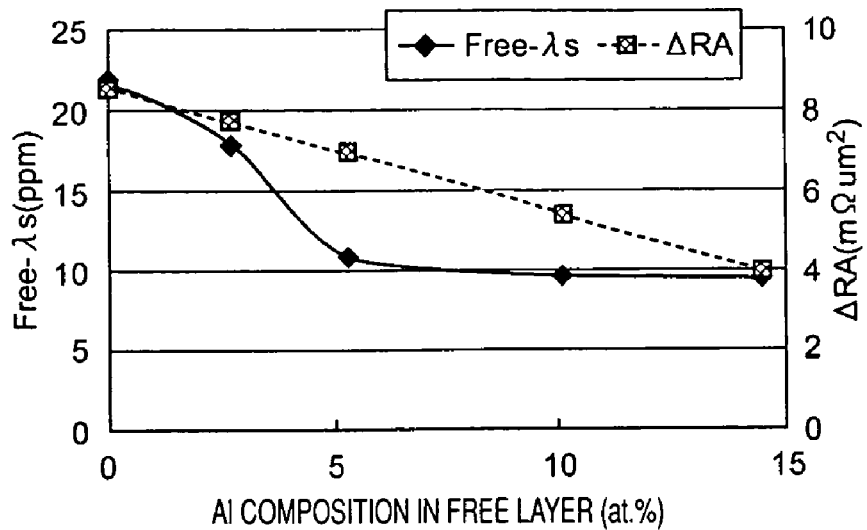
FIG. 10 is a graph showing a relationship among the composition of the free magnetic layer, the magnetostriction constant $\lambda S$, and $\Delta RA$.
Figure 11:
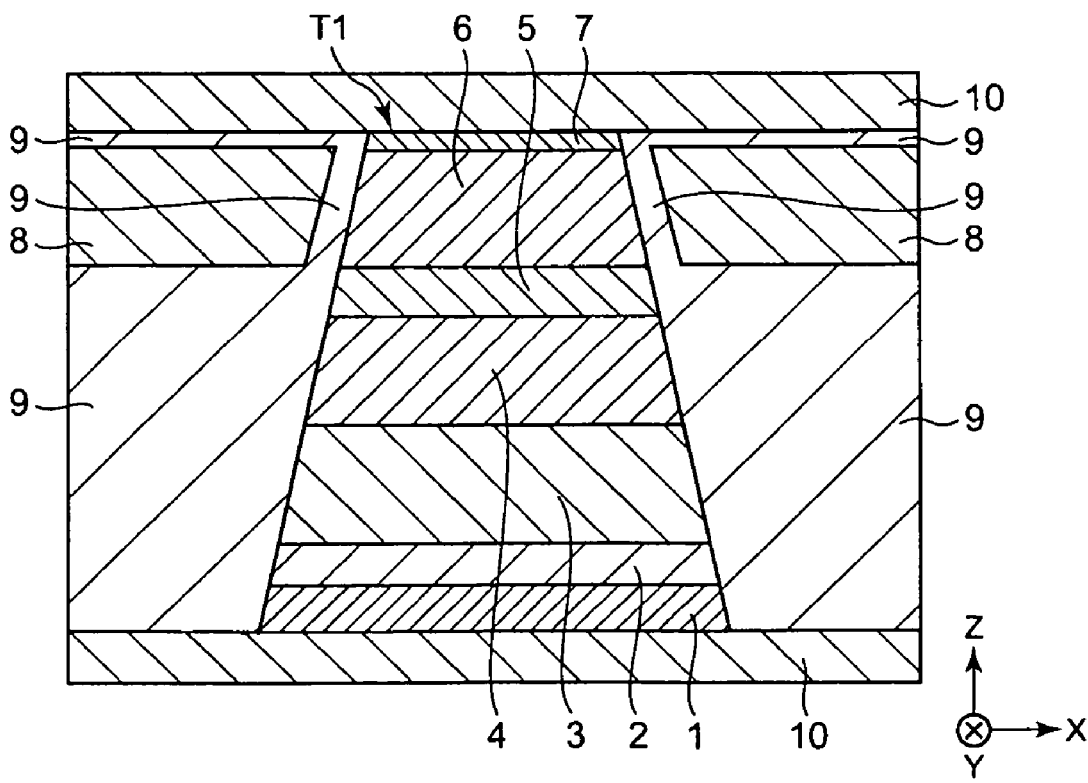
FIG. 11 is a cross-sectional view showing a conventional magnetic detecting element.

The result is shown in FIG. 10. The atomic % concentration of the element Al in the free magnetic layer is the atomic % of the element Al contained in the free magnetic layer when the total atoms configuring the free magnetic layer is 100 atomic %. The atomic % concentration of the element Al is uniform whether the element Al is uniformly diffused in the free magnetic layer or not.

As shown in FIG. 10, when the atomic % of the element Al in the free magnetic layer increases, the ΔRS is linearly reduced.

In addition, when the atomic % concentration of the element Al in the free magnetic layer increases, the magnetostriction is reduced, and, more particularly, when the atomic % concentration of the element Al is at least 3%, a reduction ratio of the magnetostriction is larger than a reduction ratio of ΔRS. In the present invention, it can be seen that the magnetostriction can be reduced while the ΔRS are suppressed from being reduced.

EMBODIMENT 3

A dual spin valve thin film element having the following layer structure was manufactured.

A basic layer structure was as follows: underlying layer 1; Ta (30)/seed layer 2; NiFeCr (50)/lower antiferromagnetic layer 3; IrMn (70)/lower pinned magnetic layer 4 [first magnetic layer 4a; FeCo (30)/non-magnetic intermediate layer 4b; Ru (9.1)/magnetic layer 4c2 of the non-magnetic intermediate layer side; FeCo (10)/CoMnX alloy layer 4c1; CoMn Ge (40)]/non-magnetic material layer 5; Cu (50)/free magnetic layer 6/non-magnetic material layer 7; Cu (50)/upper pinned magnetic layer 8[CoMnX alloy layer 8c1; CoMnGe (40)/magnetic layer 8c2 of the non-magnetic intermediate layer side; FeCo (10)/non-magnetic intermediate layer 8b; Ru (9.1)/first pinned magnetic layer 8a; FeCo (30)]/upper antiferromagnetic layer 9; IrMn (70)/protective layer 10; Ta (200). In addition, numerals in parentheses denote the thicknesses and the unit thereof is angstrom.

In an experiment, various magnetic detecting elements in which a laminated structure of the free magnetic layer 6 (before the heat treatment) is [CoMnGe(20)/Rh(x)]×3/CoMn Ge(20) and the Rh layer has various thickness x (angstrom) were subjected to the heat treatment. In addition, the numerals in parentheses of the laminated structures of the free magnetic layer represent the thickness (angstrom). In addition, "×3" denotes that the layer structure is laminated three times. Furthermore, in every sample, the composition ratio among the element Co, the element Mn, and the element Ge in the CoMnGe is 2:1:1.

Thereafter, a relationship between the thickness x (angstrom) of the Rh layer of the free magnetic layer and the magnetostriction constant λs of the free magnetic layer and a relationship between the thickness x (angstrom) of the Rh layer of the free magnetic layer and ΔRS of the magnetic detecting element were examined. The result is shown in FIG. 12.

Figure 12:
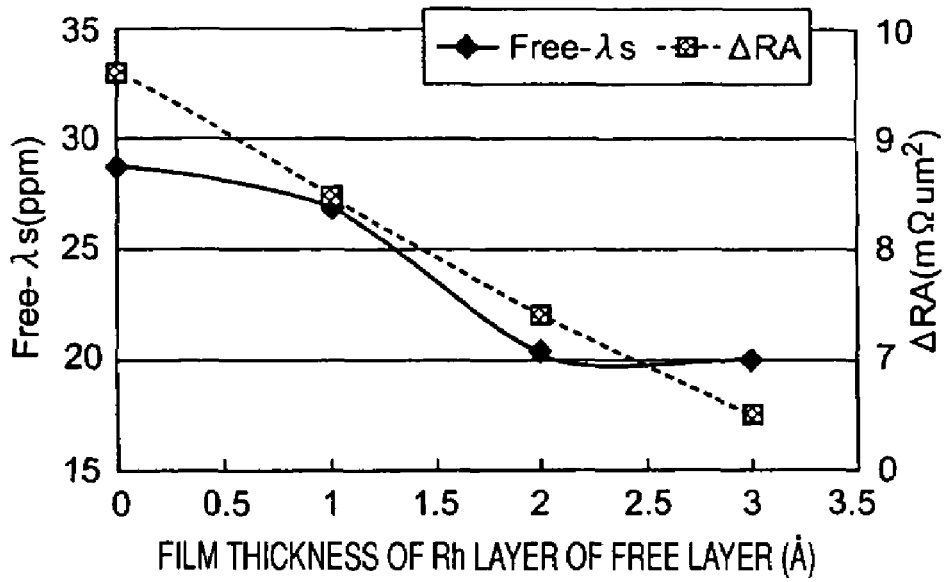
FIG. 12 is a graph showing a relationship between the thickness of a Rh layer of the free magnetic layer and the magnetostriction constant $\lambda S$.

As shown in FIG. 12, when the thickness x (angstrom) of the Rh layer of the free magnetic layer increases, the ΔRS is linearly reduced. Even when the thickness of the Rh layer is 3 angstroms, ΔRS exceeds 6 mΩ·µm².

In addition, when the thickness x (angstrom) of the Rh layer of the free magnetic layer increases, the magnetostriction is reduced. In particular, it can be seen that, when the thickness x (angstrom) of the Rh layer of the free magnetic layer is at least 1 angstroms, a reduction ratio of the magnetostriction constant λs increases, and, when the thickness x (angstrom) of the Rh layer of the free magnetic layer is in a range of 2 angstroms to 3 angstroms, the magnetostriction constant λs becomes a minimum. In the present invention, it can be seen that the magnetostriction can be reduced while the ΔRS are suppressed from being reduced.

Furthermore, when the thickness x (angstrom) of the Rh layer of the free magnetic layer is in a range from 1 angstroms to 3 angstroms, the atomic % concentration of element Rh in the free magnetic layer after the heat treatment is in a range of 4 atomic % to 10 atomic %, and, when the thickness x (angstrom) of the Rh layer of the free magnetic layer is in a range of 2 angstroms to 3 angstroms, the atomic % concentration of element Rh in the free magnetic layer after the heat treatment is in a range of 7 atomic % to 10 atomic %.

Figure 13:
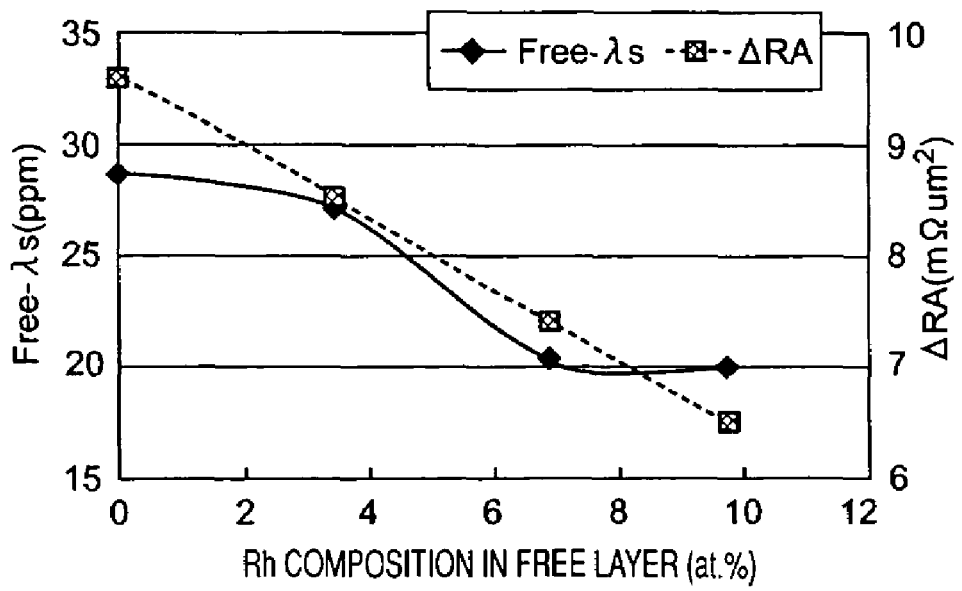
FIG. 13 is a graph showing a relationship among the composition of the free magnetic layer, the magnetostriction constant λS, and ΔRA.

In addition, a relationship between the atomic % concentration of the element Rh in the free magnetic layer after the heat treatment and the magnetostriction constant λs of the free magnetic layer and a relationship between the atomic % concentration of the element Rh in the free magnetic layer and ΔRS of the magnetic detecting element were examined. The result is shown in FIG. 13. The atomic % concentration of the element Rh in the free magnetic layer is the atomic % of the element Al contained in the free magnetic layer when the total atoms configuring the free magnetic layer is 100 atomic %. The atomic % concentration of the element Rh is uniform whether the element Rh is uniformly diffused in the free magnetic layer or not.

As shown in FIG. 13, when the atomic % of the element Rh in the free magnetic layer increases, the ΔRS is linearly reduced. Even when the atomic % of the element Rh is 10 atomic %, (RS exceeds 6 m(((m2.

In addition, when the atomic % concentration of the element Rh in the free magnetic layer increases, the magnetostriction is reduced. In particular, it can be seen that, when the atomic % concentration of the element Rh is at least 4%, a reduction ratio of the magnetostriction increases, and, when the element % concentration of the element Rh is in a range from 7 atomic % to 10 atomic %, the magnetostriction constant (s becomes a minimum. In the present invention, it can be seen that the magnetostriction can be reduced while the (RS are suppressed from being reduced.

What is claimed is:

1. A magnetic detecting element comprising:
    a pinned magnetic layer wherein the magnetization direction is pinned,
    a free magnetic layer formed on the pinned magnetic layer;
    wherein a non-magnetic material layer is disposed between the pinned magnetic layer and the free magnetic layer, and
    wherein the magnetization direction is changed by an external magnetic field,
    wherein the free magnetic layer has a CoMnXZ alloy layer made of metal compound represented by a composition formula of $Co_g Mn_h X_i Z_j$ (element X is at least one element or two elements of Ge, Ga, In, Si, Pb, and Zn, element Z is at least one element or two elements of Al, Sn, and Cr, g, h, i, and j are atomic %, and g+h+i+j=100 atomic %), and
    wherein the composition ratio of the element Z is modulated from the bottom to the top of the CoMnXZ alloy layer.

2. The magnetic detecting element according to claim 1, wherein a region in which the composition ratio of the element Z increases and a region in which the composition ratio of the element Z decreases alternately appear from the bottom to the top of the CoMnXZ alloy layer.

3. The magnetic detecting element according to claim 1, wherein the atomic % concentration of the element Z in the CoMnXZ alloy layer is in a range of 3 atomic % to 15 atomic %.

4. A magnetic detecting element comprising a pinned magnetic layer of which the magnetization direction is pinned, and a free magnetic layer which is formed on the pinned magnetic layer having a non-magnetic material layer in between and of which the magnetization direction is changed by an external magnetic field,
    wherein the free magnetic layer has a laminate of a CoMnX alloy layer made of metal compound represented by a composition formula of $Co_g Mn_h X_i$ (element X is at least one element or two elements of Ge, Ga, In, Si, Pb, and Zn, and g+h+i=100 atomic %) and an intermediate layer made of at least one element or two elements of Al, Sn, and Cr.

5. The magnetic detecting element according to claim 4, wherein, when a laminated structure in which the CoMnX layer and the intermediate layer are laminated one time forms a unit and the thickness ratio of the intermediate layer in the unit is represented by [thickness of the intermediate layer/ (thickness of the CoMnX alloy layer+thickness of the intermediate layer)], the thickness ratio of the intermediate layer is in a range of 0.08 to 0.20.

6. The magnetic detecting element according to claim 5, wherein the thickness of the intermediate layer is in a range of 1.0 angstroms to 3.0 angstroms.

7. The magnetic detecting element according to claim 1, wherein the free magnetic layer has a laminated structure in which diffusion suppressing layers made of a magnetic material are formed above and below the CoMnXZ alloy layer, and the diffusion suppressing layers are in contact with the non-magnetic material layer.

8. The magnetic detecting element according to claim 7, wherein the diffusion suppressing layers are made of a CoFe alloy.

9. The magnetic detecting element according to claim 1, wherein the magnetic detecting element comprises an antiferromagnetic layer, and the pinned magnetic layer which is in contact with the antiferromagnetic layer and of which the magnetization direction is pinned by an exchange anisotropy magnetic field with the antiferromagnetic layer, and the free magnetic layer which is formed on the pinned magnetic layer having the non-magnetic material layer in between.

10. The magnetic detecting element according to claim 1, wherein the magnetic detecting element comprises non-magnetic material layers laminated above and below the free magnetic layer, and pinned magnetic layers located above one of the non-magnetic material layers and below the other of the non-magnetic material layers.

11. The magnetic detecting element according to claim 10, further comprising antiferromagnetic layers which are located above one of the pinned magnetic layers and below the other of the pinned magnetic layers to pin the magnetization directions of the pinned magnetic layers to a predetermined direction by an exchange anisotropy magnetic field.

12. The magnetic detecting element according to claim 1, wherein sensing current flows in a direction perpendicular to the film planes of the pinned magnetic layer, the non-magnetic material layer, and the free magnetic layer.

13. A method of manufacturing a magnetic detecting element having a pinned magnetic layer of which the magnetization direction is pinned, and a free magnetic layer which is formed on the pinned magnetic layer having a non-magnetic material layer in between and of which the magnetization direction is changed by an external magnetic field,
wherein the free magnetic layer has a laminate of a CoMnX alloy layer made of metal compound represented by a composition formula of $Co_gMn_hX_i$ (element X is at least one element or two elements of Ge, Ga, In, Si, Pb, and Zn, and g+h+i=100 atomic %) and an intermediate layer made of at least one element or two elements of Al, Sn, and Cr.

14. The method of manufacturing the magnetic detecting element according to claim 13, wherein, when a laminated structure in which the CoMnX layer and the intermediate layer are laminated one time forms a unit and the thickness ratio of the intermediate layer in the unit is represented by [thickness of the intermediate layer/(thickness of the CoMnX alloy layer+thickness of the intermediate layer)], the thickness ratio of the intermediate layer is in a range of 0.08 to 0.20.

15. The method of manufacturing the magnetic detecting element according to claim 13, wherein the thickness of the intermediate layer is in a range of 1.0 angstroms to 3.0 angstroms.

16. The method of manufacturing the magnetic detecting element according to claim 13, wherein the thickness of the CoMnX alloy layer is in a range of 10 angstroms to 40 angstroms.

17. The method of manufacturing the magnetic detecting element according to claim 13, wherein the magnetic detecting element is subjected to a heat treatment after forming the magnetic detecting element.

18. A magnetic detecting element comprising a pinned magnetic layer of which the magnetization direction is pinned, and a free magnetic layer which is formed on the pinned magnetic layer having a non-magnetic material layer in between and of which the magnetization direction is changed by an external magnetic field,
wherein the free magnetic layer has a CoMnXRh alloy layer made of metal compound represented by a composition formula of $Co_gMn_hX_iRh_j$ (element X is at least one element or two elements of Ge, Ga, In, Si, Pb, Zn, Sn, Al, and Sb, g, h, i, j are atomic %, and g+h+i+j=100 atomic %), and
wherein the atomic % concentration of the element Rh in the CoMnXRh alloy layer is in a range of 4 atomic % to 10 atomic %.

19. The magnetic detecting element according to claim 18, wherein the atomic % concentration of the element Rh in the CoMnXRh alloy layer is in a range of 7 atomic % to 10 atomic %.

20. The magnetic detecting element according to claim 18, wherein the composition ratio of the element Rh is modulated from the bottom to the top of the CoMnXRh alloy layer.

21. The magnetic detecting element according to claim 20, wherein a region in which the composition ratio of the element Rh increases and a region in which the composition ratio of the element Rh decreases alternately appear from the bottom to the top of the CoMnXRh alloy layer.

22. A magnetic detecting element comprising a pinned magnetic layer of which the magnetization direction is pinned, and a free magnetic layer which is formed on the pinned magnetic layer having a non-magnetic material layer in between and of which the magnetization direction is changed by an external magnetic field,
wherein the free magnetic layer has a laminate of a CoMnX alloy layer made of metal compound represented by a composition formula of $Co_gMn_hX_i$ (element X is at least one element or two elements of Ge, Ga, In, Si, Pb, Zn, Sn, Al, and Sb, and g+h+i=100 atomic %) and an intermediate layer made of Rh, and
wherein the thickness of the intermediate layer is in a range of 1.0 angstroms to 3.0 angstroms.

23. The magnetic detecting element according to claim 22, wherein the thickness of the intermediate layer is in a range of 2.0 angstroms to 3.0 angstroms.

24. The magnetic detecting element according to claim 22, wherein, when a laminated structure in which the CoMnX layer and the intermediate layer are laminated one time forms a unit and the thickness ratio of the intermediate layer in the unit is represented by [thickness of the intermediate layer/(thickness of the CoMnX alloy layer+thickness of the intermediate layer)], the thickness ratio of the intermediate layer is in a range of 0.04 to 0.13.

25. The magnetic detecting element according to claim 18, wherein the free magnetic layer has a laminated structure in which diffusion suppressing layers made of a magnetic material are formed above and below the CoMnXRh alloy layer, and the diffusion suppressing layers are in contact with the non-magnetic material layer.

26. The magnetic detecting element according to claim 25, wherein the diffusion suppressing layers are made of a CoFe alloy.

27. The magnetic detecting element according to claim 18, wherein the magnetic detecting element comprises an antiferromagnetic layer, and the pinned magnetic layer which is in contact with the antiferromagnetic layer and of which the magnetization direction is pinned by an exchange anisotropy magnetic field with the antiferromagnetic layer, and the free magnetic layer which is formed on the pinned magnetic layer having the non-magnetic material layer in between.

28. The magnetic detecting element according to claim 18, wherein the magnetic detecting element comprises non-magnetic material layers laminated above and below the free magnetic layer, and pinned magnetic layers located above one of the non-magnetic material layers and below the other of the non-magnetic material layers.

29. The magnetic detecting element according to claim 28, further comprising antiferromagnetic layers which are located above one of the pinned magnetic layers and below the other of the pinned magnetic layers to pin the magnetization directions of the pinned magnetic layers to a predetermined direction by an exchange anisotropy magnetic field.

30. The magnetic detecting element according to claim 18, wherein sensing current flows in a direction perpendicular to the film planes of the pinned magnetic layer, the non-magnetic material layer, and the free magnetic layer.

31. A method of manufacturing a magnetic detecting element having a pinned magnetic layer of which the magnetization direction is pinned, and a free magnetic layer which is formed on the pinned magnetic layer having a non-magnetic material layer in between and of which the magnetization direction is changed by an external magnetic field, wherein the free magnetic layer has a laminate of a CoMnX alloy layer made of metal compound represented by a composition formula of $Co_gMn_hX_i$ (element X is at least one element or two elements of Ge, Ga, In, Si, Pb, Zn, Sn, Al, and Sb, and g+h+i=100 atomic %) and an intermediate layer made of Rh, and wherein the thickness of the intermediate layer is in a range of 1.0 angstroms to 3.0 angstroms.

32. The method of manufacturing the magnetic detecting element according to claim 31, wherein the thickness of the intermediate layer is in a range of 2.0 angstroms to 3.0 angstroms.

33. The method of manufacturing the magnetic detecting element according to claim 31, wherein, when a laminated structure in which the CoMnX layer and the intermediate layer are laminated one time forms a unit and the thickness ratio of the intermediate layer in the unit is represented by [thickness of the intermediate layer/(thickness of the CoMnX alloy layer+thickness of the intermediate layer)], the thickness ratio of the intermediate layer is in a range of 0.04 to 0.13.

34. The method of manufacturing the magnetic detecting element according to claim 31, wherein the thickness of the CoMnX alloy layer is in a range of 10 angstroms to 40 angstroms.

35. The method of manufacturing the magnetic detecting element according to claim 31, wherein the magnetic detecting element is subjected to a heat treatment after forming the magnetic detecting element.

* * * * *